(12) United States Patent
Lee et al.

(10) Patent No.: US 12,178,096 B2
(45) Date of Patent: Dec. 24, 2024

(54) DISPLAY PANEL INCLUDING CORNER DISPLAY AREA AND DISPLAY APPARATUS INCLUDING THE DISPLAY PANEL

(71) Applicant: SAMSUNG DISPLAY CO., LTD., Yongin-si (KR)

(72) Inventors: Yujin Lee, Yongin-si (KR); Heejean Park, Yongin-si (KR); Mukyung Jeon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/210,603

(22) Filed: Jun. 15, 2023

(65) Prior Publication Data

US 2024/0023390 A1    Jan. 18, 2024

Related U.S. Application Data

(63) Continuation of application No. 17/343,839, filed on Jun. 10, 2021, now Pat. No. 11,716,885.

(30) Foreign Application Priority Data

Sep. 7, 2020   (KR) .................. 10-2020-0114115

(51) Int. Cl.
 *H10K 59/131* (2023.01)
 *H10K 77/10* (2023.01)
 *H10K 102/00* (2023.01)

(52) U.S. Cl.
 CPC .......... *H10K 59/131* (2023.02); *H10K 77/111* (2023.02); *H10K 2102/311* (2023.02)

(58) Field of Classification Search
 CPC ............... H10K 59/131; H10K 77/111; H10K 2102/311; H10K 59/12; H10K 59/121; G09G 3/3225; H01L 27/1218

See application file for complete search history.

(56) References Cited

U.S. PATENT DOCUMENTS 10,332,947 B2   6/2019  Kim et al.
11,716,885 B2 *  8/2023  Lee .................. H10K 59/131
                                                     257/773

(Continued)

FOREIGN PATENT DOCUMENTS

CN       108766977 A    11/2018
CN       111243442 A     6/2020

(Continued)

OTHER PUBLICATIONS

Extended European Search Report for Application No. 21191565.7 dated Feb. 2, 2022.

*Primary Examiner* — J. E. Schoenholtz
(74) *Attorney, Agent, or Firm* — CANTOR COLBURN LLP

(57) ABSTRACT

A display panel includes a substrate including a first display area, a first side display area, a second side display area, and a corner display area, the corner display area being arranged between the first side display area and the second side display area and surrounding at least a portion of the first display area, a first wiring extending in a first direction in the first display area, a second wiring extending in a second direction in the first display area, a first corner wiring arranged in the corner display area and connected to the first wiring, a second corner wiring arranged in the corner display area and connected to the second wiring, and a pixel circuit arranged in the corner display area, where the first corner wiring and the second corner wiring extend in a first extension direction in the corner display area.

20 Claims, 23 Drawing Sheets

(56) References Cited

U.S. PATENT DOCUMENTS

| | | | |
|---|---|---|---|
| 11,737,307 B1* | 8/2023 | Soyseven | H10K 59/00 |
| | | | 257/40 |
| 2018/0040683 A1 | 2/2018 | Matsueda et al. | |
| 2018/0158895 A1 | 6/2018 | Lee et al. | |
| 2019/0027090 A1 | 1/2019 | Nonaka et al. | |
| 2019/0214450 A1 | 7/2019 | Lee et al. | |
| 2020/0176696 A1 | 6/2020 | Dai | |
| 2021/0325710 A1 | 10/2021 | Koide et al. | |
| 2022/0123087 A1 | 4/2022 | Yu et al. | |
| 2022/0139314 A1* | 5/2022 | Chu | G09G 3/3225 |
| | | | 345/694 |
| 2022/0238616 A1 | 7/2022 | Lin et al. | |
| 2023/0073626 A1* | 3/2023 | Du | H10K 59/131 |
| 2023/0263004 A1* | 8/2023 | Soyseven | H10K 77/111 |
| | | | 257/40 |

FOREIGN PATENT DOCUMENTS

| | | |
|---|---|---|
| EP | 3660818 A1 | 6/2020 |
| KR | 1020180026599 A | 3/2018 |
| KR | 1020190086066 A | 7/2019 |
| KR | 102056666 B1 | 12/2019 |

* cited by examiner

DISPLAY PANEL INCLUDING CORNER DISPLAY AREA AND DISPLAY APPARATUS INCLUDING THE DISPLAY PANEL

This application is a continuation of U.S. patent application Ser. No. 17/343,839, filed on Jun. 10, 2021, which claims priority to Korean Patent Application No. 10-2020-0114115, filed on Sep. 7, 2020, and all the benefits accruing therefrom under 35 U.S.C. § 119, the content of which in its entirety is herein incorporated by reference.

BACKGROUND

1. Field

One or more embodiments relate to a display panel including an enlarged display area that displays an image and a display apparatus including the display panel.

2. Description of Related Art

Mobile electronic apparatuses are widely being used. As mobile electronic apparatuses, not only miniaturized electronic apparatuses such as mobile phones but also tablet personal computers ("PCs") are widely being used recently.

To support various functions, a mobile electronic apparatus includes a display apparatus to provide a user with visual information such as an image. Recently, because parts for driving a display apparatus have been miniaturized, a proportion of the display apparatus in an electronic apparatus is gradually being increased and a structure that may be bent by a predetermined angle with respect to a flat state is also under development.

A display panel of a display apparatus that displays an image may have various curvatures, and include a first (e.g., front) display area, a first side display area and a second side display area, for example. The first side display area is connected to the front display area in a first direction and is bent, and the second side display area is connected to the front display area in a second direction and is bent.

SUMMARY

One or more embodiments include a display panel including a corner display area and a display apparatus, where the corner display area is arranged to correspond to a corner of a front display area and is bendable.

Additional features will be set forth in part in the description which follows and, in part, will be apparent from the description, or may be learned by practice of the presented embodiments of the invention.

A display panel in an embodiment includes a substrate including a first display area, a first side display area, a second side display area, and a corner display area, the first side display area being connected to the first display area in a first direction, the second side display area being connected to the first display area in a second direction intersecting the first direction, and the corner display area being arranged between the first side display area and the second side display area and surrounding at least a portion of the first display area, a first wiring extending in the first direction in the first display area, a second wiring extending in the second direction in the first display area, a first corner wiring arranged in the corner display area and connected to the first wiring, a second corner wiring arranged in the corner display area and connected to the second wiring, and a pixel circuit arranged in the corner display area and connected to the first corner wiring and the second corner wiring, where the first corner wiring and the second corner wiring extend in a first extension direction intersecting the first direction and the second direction in the corner display area.

In an embodiment, the corner display area may include a plurality of extension regions extending in a direction away from the first display area, a space may be defined between adjacent extension regions of the plurality of extension regions, a first extension region of the plurality of extension regions may extend in a first extension direction, and the first corner wiring and the second corner wiring may be arranged in the first extension region.

In an embodiment, the first extension region may include a central region, a first outer region, and a second outer region, the central region extending in the extension direction, and the first outer region and the second outer region being arranged respectively on two opposite sides of the central region, one of the first corner wiring and the second corner wiring may be arranged in the central region, and a remaining one of the first corner wiring and the second corner wiring may be arranged in at least one of the first outer region and the second outer region.

In an embodiment, the display panel may further include a bridge line arranged in the first extension region and extending in a first perpendicular direction perpendicular to the first extension direction, where the remaining one of the first corner wiring and the second corner wiring may be connected to the pixel circuit through the bridge line.

In an embodiment, the pixel circuit may be provided in plural in the first extension region, and the second corner wiring may be connected to two of a plurality of pixel circuits.

In an embodiment, the pixel circuit may include a first line pixel circuit and a second line pixel circuit, the first line pixel circuit being arranged in a first line extending in the first extension direction, and the second line pixel circuit extending being arranged in a second line parallel to the first line, and the remaining one of the first corner wiring and the second corner wiring may be connected to the first line pixel circuit and the second line pixel circuit.

In an embodiment, the plurality of extension regions may further include a second extension region, the second extension region neighboring the first extension region and extending in a second extension direction that intersects the first direction and the second direction, and the display panel may further include a third corner wiring extending in the second extension direction in the second extension region, and a connection bridge line connecting the second corner wiring to the third corner wiring.

In an embodiment, the pixel circuit may include a first pixel circuit, a second pixel circuit, and a third pixel circuit that are arranged side by side, the first corner wiring may include a first data line, a second data line, and a third data line that extend side by side in the first extension direction, and the first pixel circuit, the second pixel circuit, and the third pixel circuit may be respectively connected to the first data line, the second data line, and the third data line.

In an embodiment, the first pixel circuit, the second pixel circuit, and the third pixel circuit may be arranged side by side in a first perpendicular direction perpendicular to the first extension direction.

In an embodiment, the first pixel circuit, the second pixel circuit, and the third pixel circuit may be arranged side by side in the first extension direction.

In an embodiment, the pixel circuit may be arranged in plural in the corner display area, and a plurality of pixel circuits may be arranged side by side in the first extension direction.

In an embodiment, the second corner wiring may include a lower wiring and an upper wiring arranged in different layers, and the lower wiring and the upper wiring may be alternately arranged in a first perpendicular direction perpendicular to the first extension direction.

In an embodiment, the substrate may further include an intermediate display area arranged between the corner display area and the first display area, and the display panel may further include a driving circuit arranged in the intermediate display area, where the second corner wiring may be connected to the driving circuit, and may extend from the intermediate display area to the corner display area.

A display apparatus in an embodiment includes a display panel including a substrate including a first display area and a corner display area, the corner display area being arranged at a corner of the first display area and bent, a first wiring extending in a first direction in the front display area, a second wiring extending in a second direction in the first display area, the second direction intersecting the first direction, a first corner wiring arranged in the corner display area and connected to the first wiring, a second corner wiring arranged in the corner display area and connected to the second wiring, and a pixel circuit arranged in the corner display area and connected to the first corner wiring and the second corner wiring, and a cover window covering the display panel, where the first corner wiring and the second corner wiring extend in a first extension direction while the corner display area is unbent, the first extension direction intersecting the first direction and the second direction.

In an embodiment, with the corner display area unbent, the corner display area may include a plurality of extension regions extending in a direction away from the first display area, and the first corner wiring and the second corner wiring may be arranged in a first extension region extending in the first extension direction from among the plurality of extension regions.

In an embodiment, the first extension region may include a central region, a first outer region, and a second outer region, the first outer region and the second outer region being arranged respectively on two opposite sides of the central region, one of the first corner wiring and the second corner wiring may be arranged in the central region, and a remaining one of the first corner wiring and the second corner wiring may be arranged in at least one of the first outer region and the second outer region.

In an embodiment, the display panel may further include a bridge line arranged in the first extension region and extending in a direction to at least one of the first outer region and the second outer region from the central region, and the remaining one of the first corner wiring and the second corner wiring may be connected to the pixel circuit through the bridge line.

In an embodiment, the second corner wiring may include a lower wiring and an upper wiring arranged in different layers, and the lower wiring and the upper wiring may be alternately arranged in a direction to at least one of the first outer region and the second outer region from the central region.

In an embodiment, the substrate may further include an intermediate display area arranged between the corner display area and the first display area, the display panel may further include a driving circuit arranged in the intermediate display area, and the second corner wiring may be connected to the driving circuit, and may extend from the intermediate display area to the corner display area.

In an embodiment, the display panel may further include a first side display area connected to the first display area in the first direction and bent with a first curvature radius, and a second side display area connected to the first display area in the second direction and bent with a second curvature radius different from the first curvature radius, where the corner display area may surround the first display area between the first side display area and the second side display area.

A display panel in an embodiment includes a substrate including a first display area, a first side display area, a second side display area, and a corner display area, the first side display area extending in a first direction from the first display area, the second side display area extending in a second direction from the first display area, the second direction intersecting the first direction, and the corner display area being arranged between the first side display area and the second side display area, a first wiring extending in the first direction in the first display area, a second wiring extending in the second direction in the first display area, a first corner wiring arranged in the corner display area and connected to the first wiring, a second corner wiring arranged in the corner display area and connected to the second wiring, and a pixel circuit arranged in the corner display area and connected to the first corner wiring and the second corner wiring, where the corner display area include a plurality of extension regions extending in a direction away from the first display area, a space is defined between neighboring extension regions of the plurality of extension regions, a first extension region extends in a first extension direction from among the plurality of extension regions, the first extension direction intersecting the first direction and the second direction, and the first corner wiring and the second corner wiring extend in the first extension direction in the first extension region.

BRIEF DESCRIPTION OF THE DRAWINGS

The above and other aspects, features, and advantages of certain embodiments of the invention will be more apparent from the following description taken in conjunction with the accompanying drawings, in which.

DETAILED DESCRIPTION

Figure 1:
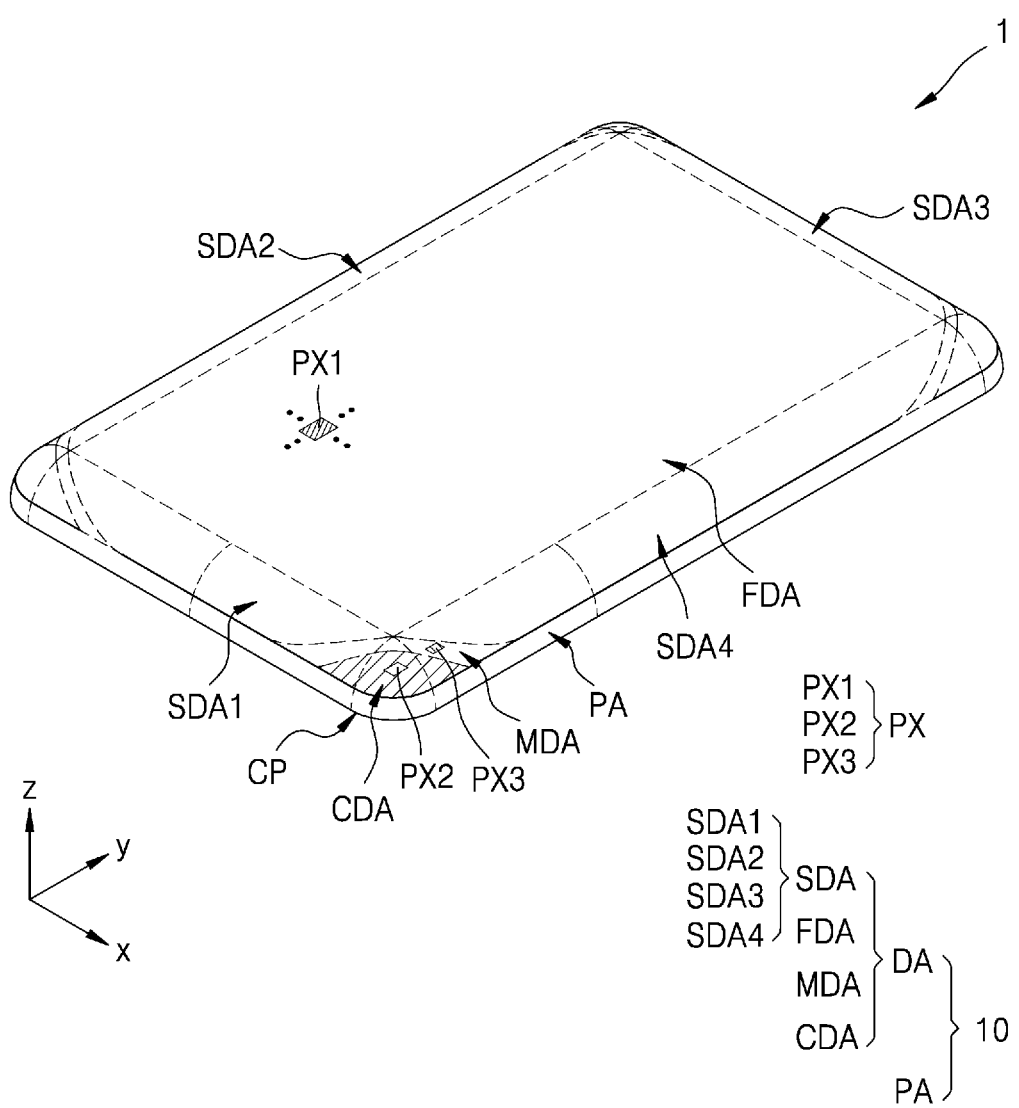
FIG. 1 is a perspective view of an embodiment of a display apparatus.

Reference will now be made in detail to embodiments, examples of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the description allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, where like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

When an embodiment may be implemented differently, a certain process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

Figure 2A:
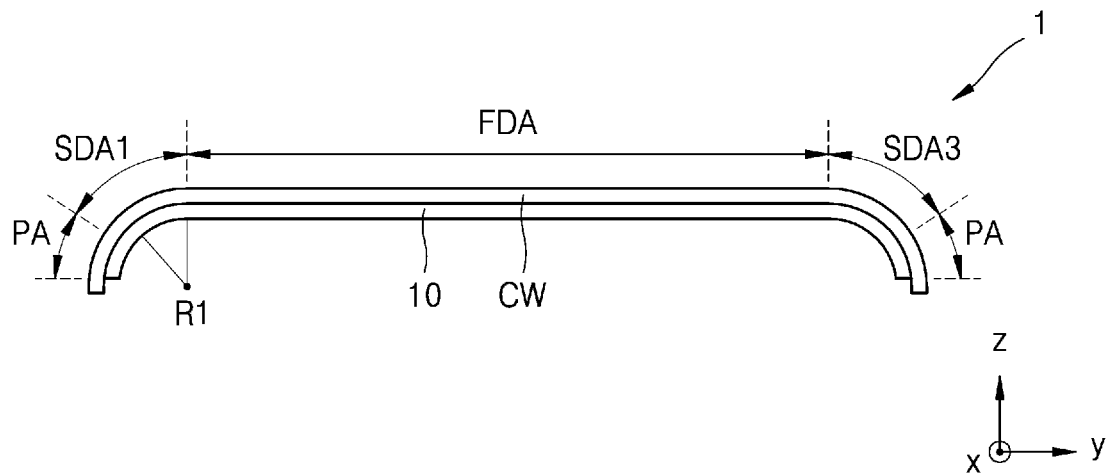
FIGS. 2A, 2B, and 2C are cross-sectional views of an embodiment of a display apparatus.
Figure 2B:
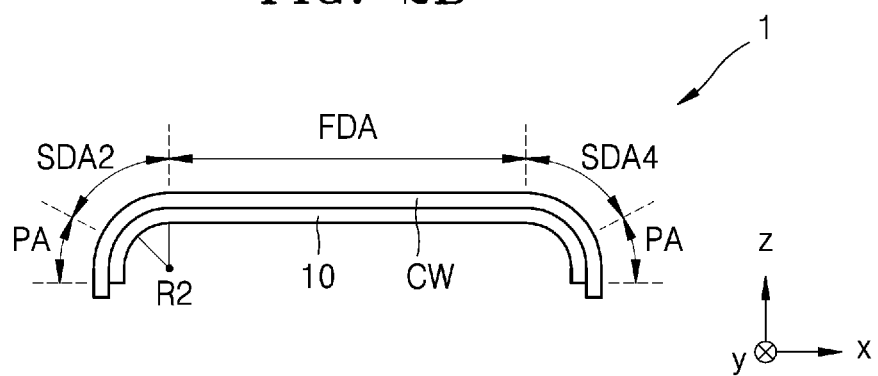
Figure 2C:
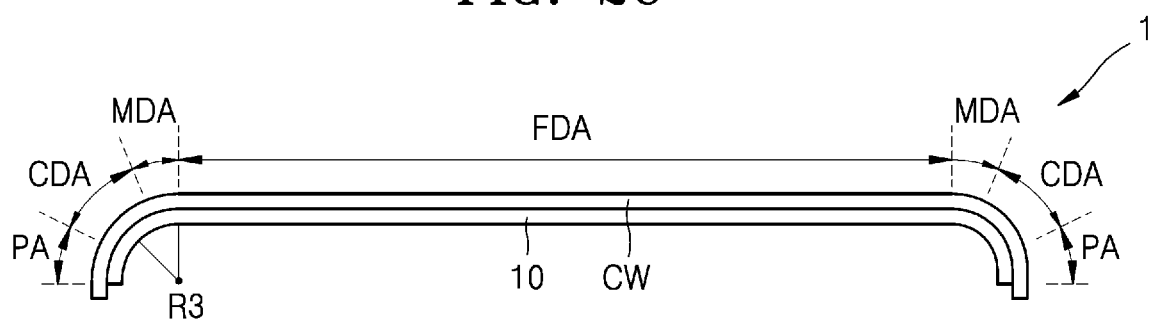

FIG. 1 is a perspective view of an embodiment of a display apparatus 1. FIGS. 2A, 2B, and 2C are cross-sectional views of an embodiment of the display apparatus 1. FIG. 2A shows a cross-section of the display apparatus 1 in a y-direction of FIG. 1. FIG. 2B shows a cross-section of the display apparatus 1 in an x-direction of FIG. 1. FIG. 2C shows a cross-section in which corner display areas CDA are arranged respectively on two opposite sides of a front display area FDA in the display apparatus 1.

Referring to FIGS. 1, 2A, and 2C, the display apparatus 1 is an apparatus for displaying moving images or still images and may be used as a display screen of various products including televisions, notebook computers, monitors, advertisement boards, internet of things ("IOT") as well as portable electronic apparatuses including mobile phones, smartphones, tablet personal computers ("PC"), mobile communication terminals, electronic organizers, electronic books, portable multimedia players ("PMP"), navigations, and ultra mobile personal computers ("UMPC"). In addition, the display apparatus 1 in an embodiment may be used in wearable devices including smartwatches, watchphones, glasses-type displays, and head-mounted displays ("HMD"). In addition, the display apparatus 1 in an embodiment may be used as instrument panels for automobiles, center fascias for automobiles, or center information displays ("CID") arranged on a dashboard, room mirror displays that replace side mirrors of automobiles, and displays arranged on the backside of front seats as an entertainment for back seats of automobiles.

In an embodiment, the display apparatus 1 may include a long side in a first direction and a short side in a second direction. Here, the first direction may intersect the second direction. In an embodiment, the first direction and the second direction may form an acute angle. In another embodiment, the first direction and the second direction may form an obtuse angle or a right angle. Hereinafter, the case where the first direction (e.g. a y-direction or a (−) y-direction) and the second direction (e.g. an x-direction or a (−) x-direction) form a right angle is mainly described in detail.

In another embodiment, in the display apparatus 1, the length of a side in the first direction (e.g. the y-direction or the (−) y-direction) and the length of a side in the second direction (e.g. the x-direction or the (−) x-direction) may be the same. In another embodiment, the display apparatus 1 may include a short side in the first direction (e.g. the y-direction or the (−) y-direction) and a long side in the second direction (e.g. the x-direction or the (−) x-direction).

An edge where the long side in the first direction (e.g. the y-direction or the (−) y-direction) and the short side in the second direction (e.g. the x-direction or the (−) x-direction) meet may be provided round to have a preset curvature.

The display apparatus 1 may include a display panel 10 and a cover window CW. In this case, the cover window CW may protect the display panel 10.

The cover window CW may be a flexible window. The cover window CW may protect the display panel 10 while easily warping according to external force without the occurrence of a crack, etc. The cover window CW may include glass, sapphire, or a plastic. The cover window CW may include, for example, ultra thin glass ("UTG") or colorless polyimide ("CPI"). In an embodiment, the cover window CW may have a structure in which a polymer layer having flexibility is arranged on one surface of a glass substrate, or include only a polymer layer.

The display panel 10 may be arranged under the cover window CW. Though not shown, the display panel 10 may be attached to the cover window CW through a transparent adhesive member such as an optically clear adhesive ("OCA") film.

The display panel 10 may include a display area DA and a peripheral area PA surrounding the display area DA. The display area DA may include a plurality of pixels PX and display an image through the plurality of pixels PX. The plurality of pixels PX each may include sub-pixels. In an embodiment, the plurality of pixels PX each may include a red sub-pixel, a green sub-pixel, and a blue sub-pixel. In an alternative embodiment, the plurality of pixels PX each may include a red sub-pixel, a green sub-pixel, a blue sub-pixel, and a white sub-pixel.

In the illustrated embodiment, the display area DA may include a front display area FDA, a side display area SDA, a corner display area CDA, and an intermediate display area MDA. A plurality of pixels PX in each display area may display an image. In an embodiment, the pixels PX in the front display area FDA, the side display area SDA, the corner display area CDA, and the intermediate display area MDA may each provide an independent image. In another embodiment, the pixels PX in the front display area FDA, the side display area SDA, the corner display area CDA, and the intermediate display area MDA may each provide a portion of one image.

The front display area FDA is a flat display area and may include a first pixel PX1 including a first display element. In an embodiment, the front display area FDA may provide most of an image.

A pixel PX including a display element may be arranged in the side display area SDA. Accordingly, the side display area SDA may display an image. In an embodiment, the side display area SDA may include a first side display area SDA1, a second side display area SDA2, a third side display area SDA3, and a fourth side display area SDA4. In an embodiment, at least one of the first side display area SDA1, the second side display area SDA2, the third side display area SDA3, and the fourth side display area SDA4 may be omitted.

The first side display area SDA1 and the third side display area SDA3 may be connected to the front display area FDA in the first direction (e.g. the y-direction or the (−) y-direction). In an embodiment, the first side display area SDA1 may be connected to the front display area FDA in the (−) y-direction, and the third side display area SDA3 may be connected to the front display area FDA in the y-direction.

The first side display area SDA1 and the third side display area SDA3 may be bent at a curvature radius. In an embodiment, the curvature radii of the first side display area SDA1 and the third side display area SDA3 may be different from each other. In another embodiment, the curvature radii of the first side display area SDA1 and the third side display area SDA3 may be the same. Hereinafter, the case where the curvature radii of the first side display area SDA1 and the third side display area SDA3 have the same first curvature radius R1 is mainly described in detail. In addition, the curvature radius of the first side display area SDA1 is similar to or the same as the curvature radius of the third side display area SDA3, and thus, the first side display area SDA1 is mainly described in detail.

The second side display area SDA2 and the fourth side display area SDA4 may be connected to the front display area FDA in the second direction (e.g. the x-direction or the (−) x-direction). In an embodiment, the second side display area SDA2 may be connected to the front display area FDA in the (−) x-direction, and the fourth side display area SDA4 may be connected to the front display area FDA in the x-direction.

The second side display area SDA2 and the fourth side display area SDA4 may each be bent at a curvature radius. In an embodiment, the curvature radii of the second side display area SDA2 and the fourth side display area SDA4 may be different from each other. In another embodiment, the curvature radii of the second side display area SDA2 and the fourth side display area SDA4 may be the same. Hereinafter, the case where the curvature radii of the second side display area SDA2 and the fourth side display area SDA4 have the same second curvature radius R2 is mainly described in detail. In addition, the curvature radius of the second side display area SDA2 is similar to or the same as the curvature radius of the fourth side display area SDA4, and thus, the second side display area SDA2 is mainly described in detail.

In an embodiment, the first curvature radius R1 of the first side display area SDA1 may be different from the second curvature radius R2 of the second side display area SDA2. In an embodiment, the first curvature radius R1 may be less than the second curvature radius R2. In another embodiment, the first curvature radius R1 may be greater than the second curvature radius R2. In another embodiment, the first curvature radius R1 of the first side display area SDA1 may be the same as the second curvature radius R2 of the second side display area SDA2. Hereinafter, the case where the first curvature radius R1 is greater than the second curvature radius R2 is mainly described in detail.

The corner display area CDA may be arranged in the corner of the front display area FDA and bent. That is, the corner display area CDA may correspond to a corner portion CP. Here, the corner portion CP is a corner of the display area DA and may be a portion where a long side of the display area DA in the first direction (e.g. the y-direction or the (−) y-direction) meets a short side in the second direction (the x-direction or the (−) x-direction). In addition, the corner display area CDA may be arranged between neighboring side display areas SDA. In an embodiment, the corner display area CDA may be arranged between the first side display area SDA1 and the second side display area SDA2. In an alternative embodiment, the corner display area CDA may be arranged between the second side display area SDA2 and the third side display area SDA3, between the third side display area SDA3 and the fourth side display area SDA4, or between the fourth side display area SDA4 and the first side display area SDA1. Accordingly, the side display area SDA and the corner display area CDA may surround the front display area FDA and be bent.

A second pixel PX2 including a second display element may be arranged in the corner display area CDA. Accordingly, the corner display area CDA may display an image.

In the illustrated embodiment, in the case where the curvature radius R1 of the first side display area SDA1 is different from the curvature radius R2 of the second side display area SDA2, a curvature radius in the corner display area CDA may be gradually changed. In an embodiment, in the case where the curvature radius R1 of the first side display area SDA1 is greater than the curvature radius R2 of the second side display area SDA2, a curvature radius in the corner display area CDA may be gradually reduced in a direction from the first side display area SDA1 to the second side display area SDA2. In an embodiment, a third curvature radius R3 of the corner display area CDA may be less than the first curvature radius R1 and greater than the second curvature radius R2.

In an embodiment, the display panel 10 may further include the intermediate display area MDA. The intermediate display area MDA may be arranged between the corner display area CDA and the front display area FDA. In an embodiment, the intermediate display area MDA may extend between the side display area SDA and the corner display area CDA. In an embodiment, the intermediate display area MDA may extend between the first side display area SDA1 and the corner display area CDA. In addition, the intermediate display area MDA may extend between the second side display area SDA2 and the corner display area CDA.

The intermediate display area MDA may include a third pixel PX3. In addition, in an embodiment, a driving circuit or a voltage wiring may be arranged in the intermediate display area MDA. The driving circuit may provide an electric signal, and the power wiring may provide a voltage. The third pixel PX3 may overlap the driving circuit or a power wiring. In this case, a third display element of the third pixel PX3 may be arranged over the driving circuit or the power wiring. In an embodiment, the driving circuit or the power wiring may be arranged in the peripheral area PA. The third pixel PX3 may not overlap the driving circuit or the power wiring.

In the illustrated embodiment, the display apparatus 1 may display an image in the side display areas SDA, the corner display areas CDA, the intermediate display areas MDA as well as the front display area FDA. Accordingly, a portion of the display area DA occupied in the display apparatus 1 may increase. In addition, the display apparatus 1 is bent at the corner and includes the corner display area CDA that displays an image, and thus, an aesthetic sense may be improved.

Figure 3A:
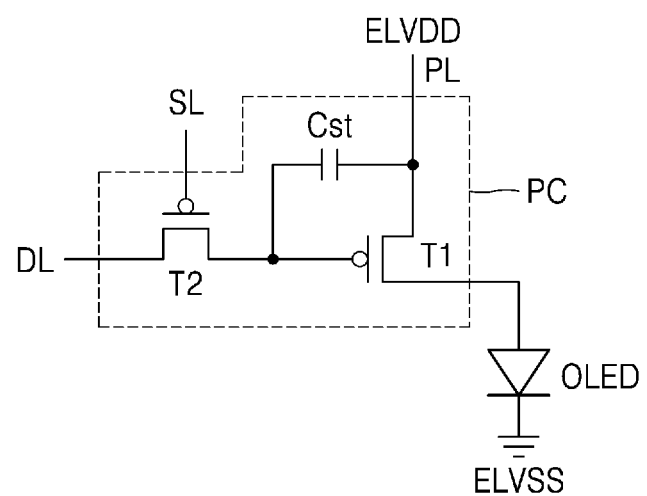
FIGS. 3A and 3B are equivalent circuit diagrams of an embodiment of a pixel circuit applicable to a display panel.
Figure 3B:
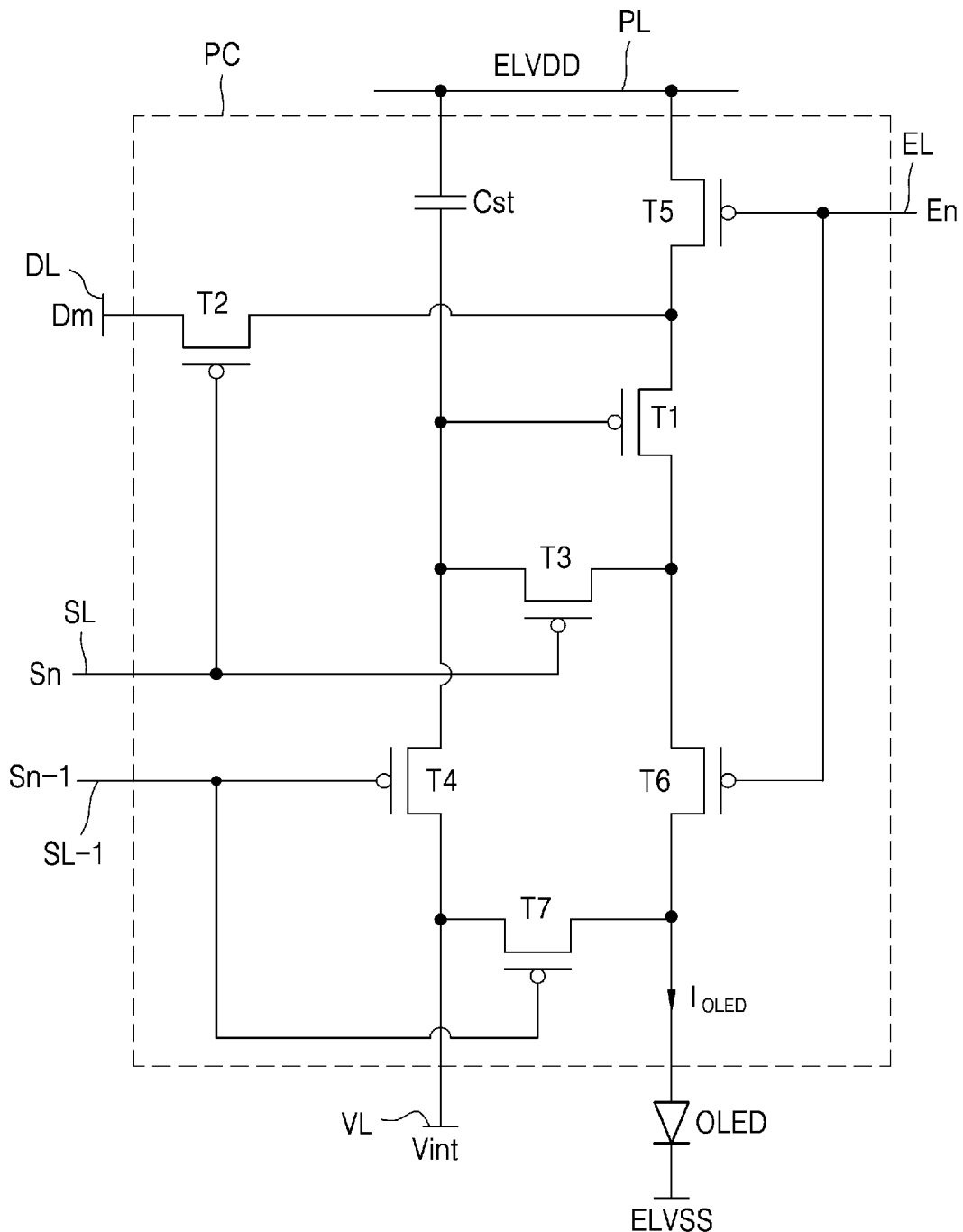

FIGS. 3A and 3B are equivalent circuit diagrams of a pixel circuit PC applicable to the display panel 10.

Referring to FIG. 3A, the pixel circuit PC may be connected to a display element, for example, an organic light-emitting diode OLED.

The pixel circuit PC may include a driving thin-film transistor T1, a switching thin-film transistor T2, and a storage capacitor Cst. In an embodiment, the organic light-emitting diode OLED may emit red, green, or blue light, or emit, red, green, blue, or white light, for example. The switching thin-film transistor T2 is connected to the scan line SL and the data line DL, and transfers a data signal or a data voltage to the driving thin-film transistor T1 according to a scan signal or a switching voltage input from the scan line SL. The data signal or the data voltage may be input from the data line DL. The storage capacitor Cst is connected to the switching thin-film transistor T2 and a driving voltage line PL, and may store a voltage corresponding to a difference between a voltage transferred from the switching thin-film transistor T2 and a first power voltage ELVDD supplied through the driving voltage line PL.

The driving thin-film transistor T1 is connected to the driving voltage line PL and the storage capacitor Cst, and may control a driving current flowing through the organic light-emitting diode OLED from the driving voltage line PL according to the voltage stored in the storage capacitor Cst. The organic light-emitting diode OLED may emit light having preset brightness according to the driving current. An opposite electrode (e.g. a cathode) of the organic light-emitting diode OLED may receive a second power voltage ELVSS.

Though it is shown in FIG. 3A that the pixel circuit PC include two thin-film transistors and one storage capacitor, the pixel circuit PC may include three, four, and five or more thin-film transistors.

Referring to FIG. 3B, the pixel circuit PC may include the driving thin-film transistor T1, the switching thin-film transistor T2, a compensation thin-film transistor T3, a first initialization thin-film transistor T4, an operation control thin-film transistor T5, an emission control thin-film transistor T6, and a second initialization thin-film transistor T7.

Though FIG. 3B shows the case where signal lines, that is, a scan line SL, a previous scan line SL-1, an emission control line EL, a data line DL, an initialization voltage line VL, and the driving voltage line PL are provided for each pixel circuit PC, at least one of signal lines, that is, a scan line SL, a previous scan line SL-1, an emission control line EL, a data line DL, and/or the initialization voltage line VL may be shared by neighboring pixel circuits in another embodiment.

A driving drain electrode of the driving thin-film transistor T1 may be electrically connected to the organic light-emitting diode OLED through the emission control thin-film transistor T6. The driving thin-film transistor T1 may receive a data signal Dm according to a switching operation of the switching thin-film transistor T2 and supply a driving current $I_{OLED}$ to the organic light-emitting diode OLED.

A switching gate electrode of the switching thin-film transistor T2 may be connected to the scan line SL, and a switching source electrode may be connected to the data line DL. A switching drain electrode of the switching thin-film transistor T2 may be connected to a source electrode of the driving thin-film transistor T1 and connected to the driving voltage line PL through the operation control thin-film transistor T5.

The switching thin-film transistor T2 is turned on according to a scan signal Sn transferred through the scan line SL and may perform a switching operation of transferring a data signal Dm transferred through the data line DL to the driving source electrode of the driving thin-film transistor T1.

A compensation gate electrode of the compensation thin-film transistor T3 may be connected to the scan line SL. A compensation source electrode of the compensation thin-film transistor T3 may be connected to the driving drain electrode of the driving thin-film transistor T1 and connected to a pixel electrode of the organic light-emitting diode OLED through the emission control thin-film transistor T6. A compensation drain electrode of the compensation thin-film transistor T3 may be connected to one of electrodes of the storage capacitor Cst, a first initialization source electrode of the first initialization thin-film transistor T4, and the driving gate electrode of the driving thin-film transistor T1, simultaneously. The compensation thin-film transistor T3 may be turned on according to a scan signal Sn transferred through the scan line SL and may diode-connect the driving thin-film transistor T1 by connecting the driving gate electrode of the driving thin-film transistor T1 to the driving drain electrode.

The first initialization gate electrode of the first initialization thin-film transistor T4 may be connected to the previous scan line SL-1. A first initialization drain electrode of the first initialization thin-film transistor T4 may be connected to the initialization voltage line VL. A first initialization source electrode of the first initialization thin-film transistor T4 may be connected to one of the electrodes of the storage capacitor Cst, the compensation drain electrode of the compensation thin-film transistor T3, and the driving gate electrode of the driving thin-film transistor T1, simultaneously. The first initialization thin-film transistor T4 is turned on according to a previous scan signal Sn-1 transferred through the previous scan line SL-1 and may perform an initialization operation of initializing the voltage of the driving gate electrode of the driving thin-film transistor T1 by transferring an initialization voltage Vint to the driving gate electrode of the driving thin-film transistor T1.

An operation control gate electrode of the operation control thin-film transistor T5 may be connected to the emission control line EL. An operation control source electrode of the operation control thin-film transistor T5 may be connected to the driving voltage line PL. An operation control drain electrode of the operation control thin-film transistor T5 may be connected to the driving source electrode of the driving thin-film transistor T1 and the switching drain electrode of the switching thin-film transistor T2.

An emission control gate electrode of the emission control thin-film transistor T6 may be connected to the emission control line EL. An emission control source electrode of the emission control thin-film transistor T6 may be connected to the driving drain electrode of the driving thin-film transistor T1 and the compensation source electrode of the compensation thin-film transistor T3. An emission control drain electrode of the emission control thin-film transistor T6 may be electrically connected to the pixel electrode of the organic light-emitting diode OLED. The operation control thin-film transistor T5 and the emission control thin-film transistor T6 are simultaneously turned on according to an emission control signal En transferred through the emission control line EL, the first power voltage ELVDD is transferred to the organic light-emitting diode OLED, and the driving current $I_{OLED}$ flows through the organic light-emitting diode OLED.

A second initialization gate electrode of the second initialization thin-film transistor T7 may be connected to the previous scan line SL-1. A second initialization source electrode of the second initialization thin-film transistor T7 may be connected to the pixel electrode of the organic light-emitting diode OLED. A second initialization drain electrode of the second initialization thin-film transistor T7 may be connected to the initialization voltage line VL. The second initialization thin-film transistor T7 may be turned on according to a previous scan signal Sn-1 transferred through the previous scan line SL-1 and may initialize the pixel electrode of the organic light-emitting diode OLED.

Though FIG. 3B shows the case where both the first initialization thin-film transistor T4 and the second initialization thin-film transistor T7 are connected to the previous scan line SL-1, the first initialization thin-film transistor T4 and the second initialization thin-film transistor T7 may be respectively connected to the previous scan line SL-1 and a next scan line (not shown), and the first initialization thin-film transistor T4 and the second initialization thin-film transistor T7 may be respectively driven according to a previous scan signal Sn-1 and a next scan signal in another embodiment.

The other of the electrodes of the storage capacitor Cst may be connected to the driving voltage line PL. One of the electrodes of the storage capacitor Cst may be connected to the driving gate electrode of the driving thin-film transistor T1, the compensation drain electrode of the compensation thin-film transistor T3, and the first initialization source electrode of the first initialization thin-film transistor T4, simultaneously.

The opposite electrode (e.g. a cathode) of the organic light-emitting diode OLED may receive the second power voltage ELVSS. The organic light-emitting diode OLED may emit light by receiving the driving current $I_{OLED}$ from the driving thin-film transistor T1.

In another embodiment, the number of thin-film transistors and the number of storage capacitors may be variously changed depending on the design of the pixel circuit PC.

Figure 4A:
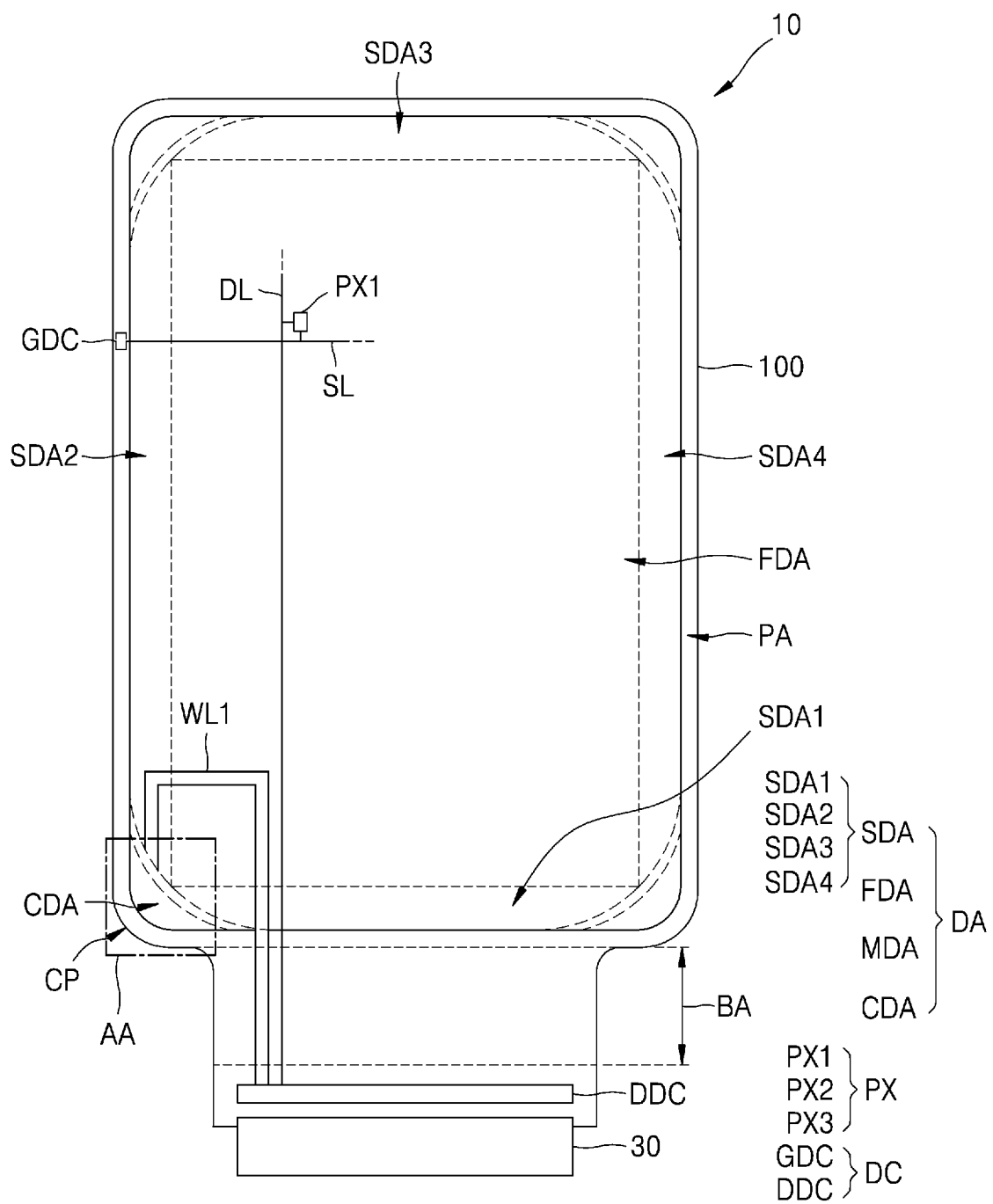
FIG. 4A is a plan view of an embodiment of a display panel.
Figure 4B:
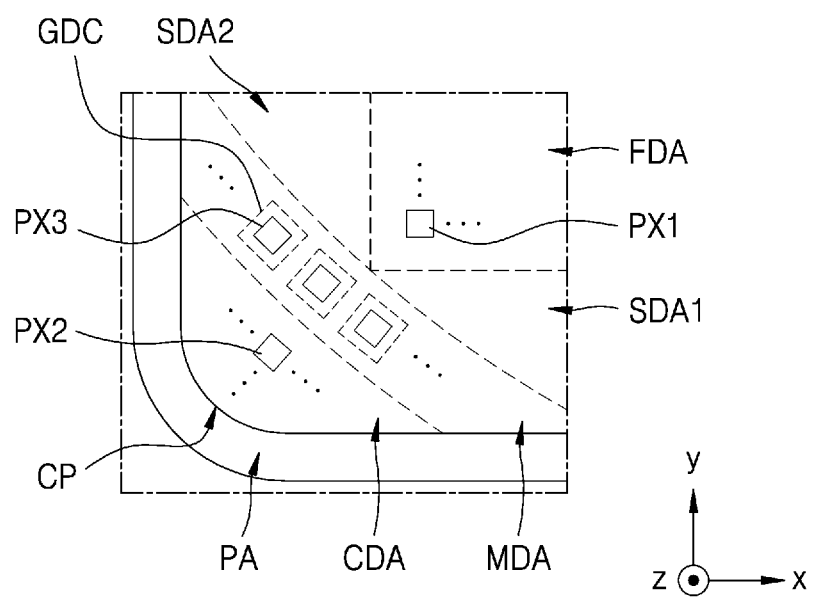
FIG. 4B is an enlarged view of a portion AA indicated by a dot-dash line in FIG. 4A.

FIG. 4A is a plan view of an embodiment of the display panel 10. FIG. 4A is a plan view of the shape of the display panel 10 before the corner display area CDA of the display panel 10 is bent. That is, FIG. 4A is a plan view of the display panel 10 with the corner display area CDA unbent. FIG. 4B is an enlarged view of a portion AA indicated by a dot-dash line in FIG. 4A The display panel 10 may include a display element. In an embodiment, the display panel 10 may include an organic light-emitting display panel that uses an organic light-emitting diode including an organic emission layer, an ultra miniaturized light-emitting diode display panel that uses a micro light-emitting diode, a quantum-dot light-emitting display panel that uses a quantum-dot light-emitting diode including a quantum-dot emission layer, and an inorganic light-emitting display panel that uses an inorganic light-emitting element including an inorganic semiconductor. Hereinafter, the case where the display panel 10 is an organic light-emitting display panel that uses an organic light-emitting diode as a display element is mainly described in detail.

Referring to FIG. 4A, the display panel 10 may include the display area DA and the peripheral area PA. The display area DA is a region in which an image is displayed by a plurality of pixels PX, and the peripheral area PA may at least partially surround the display area DA. The display area DA may include the front display area FDA, the side display area SDA, the corner display area CDA, and the intermediate display area MDA.

Each pixel PX may include sub-pixels, and the sub-pixel may emit light having a preset color from an organic light-emitting diode as a display element. Each organic light-emitting diode may emit, for example, red, green, or blue light. Each organic light-emitting diode may be connected to a pixel circuit including a thin-film transistor and a storage capacitor.

In an embodiment, the display panel 10 may include a substrate 100 and a multi-layered film on the substrate 100. In this case, the display area DA and the peripheral area PA may be defined in the substrate 100 and/or the multi-layered film. That is, the substrate 100 and/or the multi-layered film may include the front display area FDA, the side display area SDA, the corner display area CDA, the intermediate display area MDA, and the peripheral area PA.

In an embodiment, the substrate 100 may include glass or a polymer resin such as polyethersulfone, polyarylate, polyetherimide, polyethylene naphthalate, polyethylene terephthalate, polyphenylene sulfide, polyimide, polycarbonate, cellulose tri acetate, cellulose acetate propionate. The substrate 100 including the polymer resin may be flexible, rollable, or bendable. The substrate 100 may have a multi-layered structure including a base layer including the polymer resin and a barrier layer (not shown).

The peripheral area PA is a region in which an image is not displayed and may be a non-display area. A driving circuit DC or a power wiring, etc., may be arranged in the peripheral area PA, the driving circuit DC providing an electric signal to the pixels PX, and the power wiring providing power to the pixels PX. The peripheral area PA may include a bent area BA. The peripheral area PA may be bent around the bent area BA. When the front side of the display panel 10 is viewed with the bent area BA bent, a portion of the peripheral area PA may not be viewed to a user.

The driving circuit DC may be arranged in the peripheral area PA, the driving circuit DC providing an electric signal to each pixel PX through a signal line. The driving circuit DC may include a gate driving circuit GDC and a data driving circuit DDC. The gate driving circuit GDC may include a scan driving circuit and transfer a scan signal to each pixel PX through the scan line SL. In addition, the gate driving circuit GDC may also include an emission control driving circuit and provide an emission control signal to each pixel PX through an emission control line (not shown). In an embodiment, the scan line SL and/or the emission control line may extend in the second direction (e.g. the x-direction or the (−) x-direction).

The data driving circuit DDC may provide a data signal to each pixel PX through a first wiring WL1 and/or the data line DL. In an embodiment, the data driving circuit DDC may neighbor one lateral side of the display panel 10. In an embodiment, the data driving circuit DDC may be arranged to correspond to the first side display area SDA1. The first wiring WL1 and/or the data line DL may extend in the first direction (e.g. the y-direction or the (−) y-direction). In addition, the first wiring line WL1 may be bent in the display area DA, and a portion of the first wiring line WL1 may extend in the second direction (e.g. the x-direction or the (−) x-direction) in the display area DA.

The peripheral area PA may include a pad portion (not shown), which is a region to which an electronic element or a printed circuit board, etc., may be electrically connected. The pad portion may be exposed and electrically connected to a flexible printed circuit board 30 by not being covered by an insulating layer. The flexible printed circuit board may electrically connect a controller to the pad portion and supply a signal or power transferred from the controller. In an embodiment, the data driving circuit DDC may be arranged on the flexible printed circuit board 30.

The first pixel PX1 including a first display element may be arranged in the front display area FDA. The front display area FDA may be a flat portion. In an embodiment, the front display area FDA may provide most of an image.

A pixel PX including a display element may be arranged in the side display area SDA, and the side display area may be bent. That is, as described with reference to FIG. 1, the side display area SDA may be a region that is bent from the front display area FDA. In an embodiment, the width of the side display area SDA may be gradually reduced in a direction away from the front display area FDA. In an embodiment, the side display area SDA may include the first side display area SDA1, the second side display area SDA2, the third side display area SDA3, and the fourth side display area SDA4.

The first side display area SDA1 and the third side display area SDA3 may be connected in the first direction (e.g. the y-direction or the (−) y-direction). The first side display area SDA1 and the third side display area SDA3 may extend in the first direction (e.g. the y-direction or the (−) y-direction) from the front display area FDA. In addition, the second side display area SDA2 and the fourth side display area SDA4 may be connected in the second direction (e.g. the x-direction or the (−) x-direction). The second side display area SDA2 and the fourth side display area SDA4 may extend in the second direction (e.g. the x-direction or the (−) x-direction) from the front display area FDA.

The corner display area CDA may be arranged between neighboring side display areas SDA. In an embodiment, the corner display area CDA may be arranged between the first side display area SDA1 and the second side display area SDA2. In an alternative embodiment, the corner display area CDA may be arranged between the second side display area SDA2 and the third side display area SDA3, between the third side display area SDA3 and the fourth side display area SDA4, or between the fourth side display area SDA4 and the first side display area SDA1. Hereinafter, the corner display area CDA arranged between the first side display area SDA1 and the second side display area SDA2 is mainly described in detail.

The corner display area CDA may correspond to a corner portion CP of the display area DA. Here, the corner portion CP is a corner of the display area DA and may be a portion where a long side of the display area DA in the first direction (e.g. the y-direction or the (−) y-direction) meets a short side in the second direction (the x-direction or the (−) x-direction).

In addition, the corner display area CDA may surround at least a portion of the front display area FDA. In an embodiment, the corner display area CDA may be arranged between the first side display area SDA1 and the second side display area SDA2 to surround at least a portion of the front display area FDA.

A second pixel PX2 including a display element may be arranged in the corner display area CDA, and the corner display area CDA may be bent. That is, as described with reference to FIG. 1, the corner display area CDA may be a region arranged to correspond to the corner portion CP and bent from the front display area FDA. In an embodiment, the second pixel PX2 may receive a data signal through the first wiring WL1.

The intermediate display area MDA may be arranged between the front display area FDA and the corner display area CDA. In addition, in an embodiment, the intermediate display area MDA may extend between the side display area SDA and the corner display area CDA. In an embodiment, the intermediate display area MDA may extend between the first side display area SDA1 and the corner display area CDA and/or between the second side display area SDA2 and the corner display area CDA. In an embodiment, the intermediate display area MDA may be bent.

A third pixel PX3 including a display element may be arranged in the intermediate display area MDA. In addition, in an embodiment, a gate driving circuit GDC or a power wiring (not shown) may be arranged in the intermediate display area MDA. The gate driving circuit GDC may provide an electric signal, and the power wiring may provide a voltage. In this case, the third pixel PX3 arranged in the intermediate display area MDA may overlap the gate driving circuit GDC or the power wiring. In another embodiment, the third pixel PX3 may not overlap the gate driving circuit GDC or the power wiring. In this case, the gate driving circuit GDC may be arranged along the peripheral area PA surrounding the display area DA.

At least one of the side display area SDA, the corner display area CDA, and the intermediate display area MDA may be bent. In this case, the first side display area SDA1 of the side display area SDA may be bent at a first curvature radius, and the second side display area SDA2 of the side display area SDA may be bent at a second curvature radius. In this case, in the case where the first curvature radius is greater than the second curvature radius, a curvature radius at which the corner display area CDA is bent may be gradually reduced in a direction from the first side display area SDA1 to the second side display area SDA2.

When the corner display area CDA is bent, compressive strain may be more applied to the corner display area CDA than tensile strain. In this case, a shrinkable substrate and a multi-layered structure need to be applied to the corner display area CDA. Accordingly, the shape of a stack structure of the multi-layered film or the substrate 100 arranged in the corner display area CDA may be different from the shape of a stack structure of the multi-layered film or the substrate 100 arranged in the front display area FDA. In an embodiment, the corner display area CDA may include a plurality of extension regions that extend in a direction away from the front display area FDA, and a space may be provided between adjacent extension regions of the plurality of extension regions that neighbor each other.

Figure 5A:
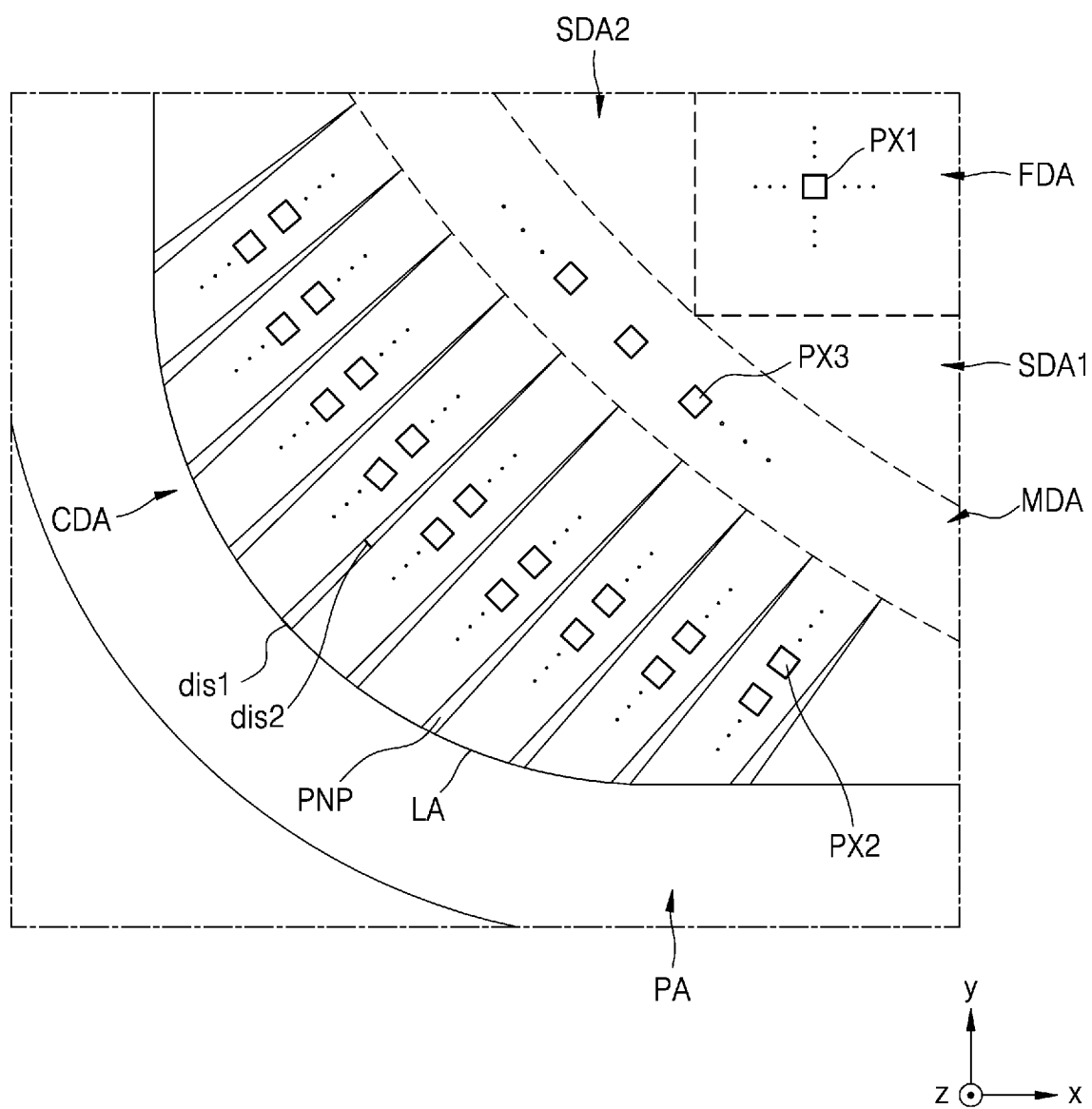
FIGS. 5A and 5B are enlarged view of an embodiment of a portion of a display panel.
Figure 5B:
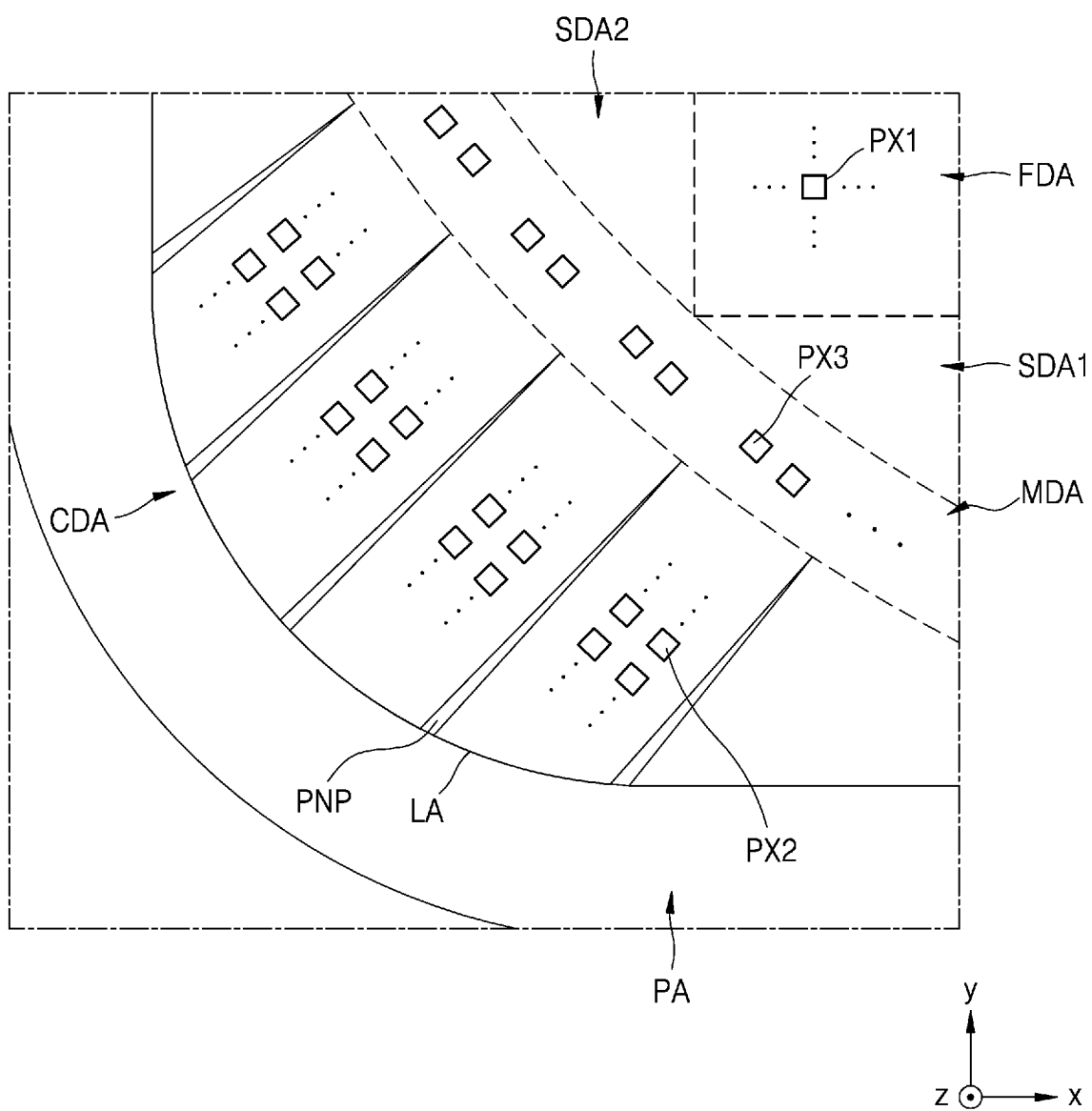

FIGS. 5A and 5B are enlarged views of an embodiment of a portion of the display panel 10.

Referring to FIGS. 5A and 5B, the display panel 10 may include the display area and the peripheral area PA. The display area may include the front display area FDA, the side display areas, that is, the first and second side display areas SDA1 and SDA2, the corner display area CDA, and the intermediate display area MDA.

The first pixel PX1 may be arranged in the front display area FDA, the second pixel PX2 may be arranged in the corner display area CDA, and the third pixel PX3 may be arranged in the intermediate display area MDA. In an embodiment, the sizes of the first to third pixels PX1, PX2, and PX3 may be the same. In another embodiment, the sizes of the first to third pixels PX1, PX2, and PX3 may be different from each other. In another embodiment, one of the sizes of the first to third pixels PX1, PX2, and PX3 may be the same as another of the sizes of the first to third pixels PX1, PX2, and PX3.

The corner display area CDA may include a plurality of extension regions LA that extend in a direction away from the front display area FDA. In this case, the plurality of extension regions LA may extend from the intermediate display area MDA. In addition, the second pixels PX2 may be arranged in each of the plurality of extension regions LA. Referring to FIG. 5A, the second pixels PX2 may be arranged in a line along a direction in which the extension regions LA extend. Referring to FIG. 5B, the second pixels PX2 may be arranged in a plurality of lines along a direction in which the extension regions LA extend.

A space PNP may be provided between adjacent extension regions of the plurality of extension regions LA. Accordingly, a vacant space may be defined between adjacent extension regions of the plurality of extension regions LA.

Referring to FIG. 5A, the width of the space PNP may gradually increase from the intermediate display area MDA to the end of the plurality of extension regions LA. That is, the width of the space PNP may increase in a direction away from the front display area FDA. In this case, the width of the space PNP denotes a separation distance between adjacent extension regions of the plurality of extension regions LA. That is, the plurality of extension regions LA may be arranged radially.

In an embodiment, a first width dis1 of the space PNP at the end portion of the extension region LA may be greater than a second width dis2 of the space PNP at any intermediate portion between the end portion and the intermediate display area MDA.

In another embodiment, the width of the space PNP may be constant in a direction from the intermediate display area MDA to the end portion of the extension region LA. In this case, the plurality of extension regions LA may extend in the same one direction from the intermediate display area MDA.

The peripheral area PA may fix the end portions of the plurality of extension regions LA. Accordingly, the plurality of extension regions LA may be fixed by the peripheral area PA. In addition, in an embodiment, a power wiring and/or a driving circuit may be arranged in the peripheral area PA. In an embodiment, the peripheral areas PA may be spaced apart from each other to respectively correspond to the plurality of extension regions LA. In this case, the space PNP may extend to the peripheral area PA between adjacent extension regions of the plurality of extension regions LA.

In the illustrated embodiment, the space PNP is provided between adjacent extension regions of the plurality of extension regions LA, and thus, a power wiring that supplies power to the second pixel PX2, or signal lines that transfer a signal to the second pixel PX2 may not be arranged in the first direction (e.g. the y-direction or the (−) y-direction) and/or the second direction (e.g. the x-direction or the (−) x-direction) as in the front display area FDA. Accordingly, the wirings may be arranged in an extension direction intersecting the first direction (e.g. the y-direction or the (−) y-direction) and/or the second direction (e.g. the x-direction or the (−) x-direction). In an embodiment, the wirings may be arranged in a direction in which the plurality of extension regions LA extend. This is described below. A stack structure of a multi-layered film arranged in the front display area FDA is described first in detail.

Figure 6A:
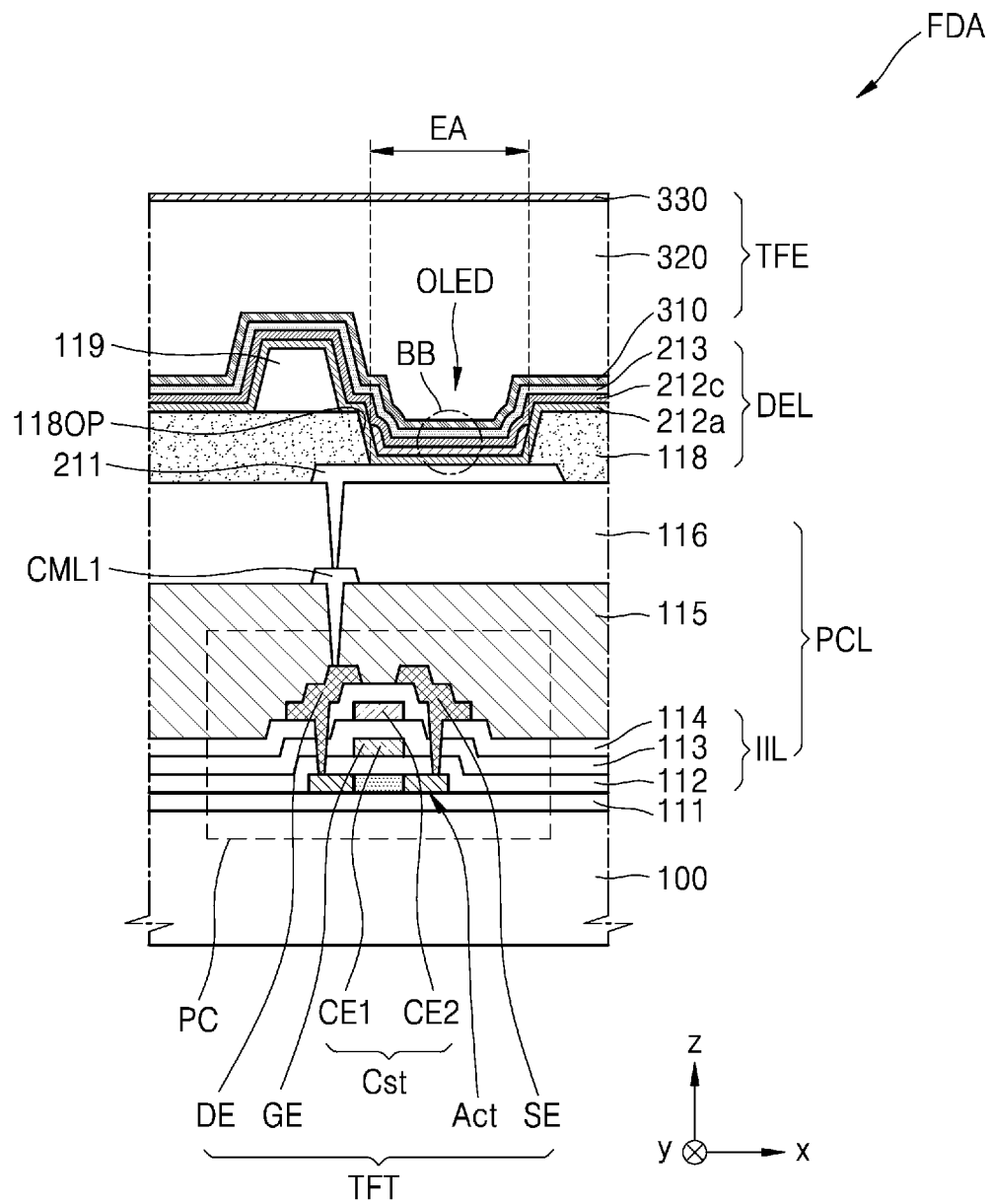
FIG. 6A is a cross-sectional view of an embodiment of a front display area.
Figure 6B:
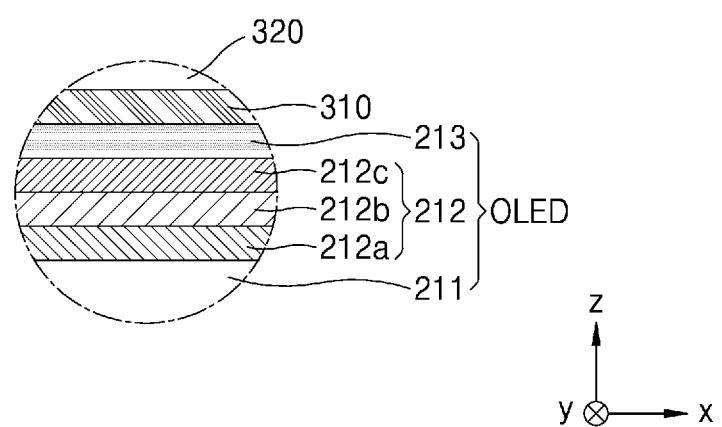
FIG. 6B is an enlarged view of a portion BB indicated by a dot-dash line in FIG. 6A.

FIG. 6A is a cross-sectional view of an embodiment of the front display area FDA. FIG. 6B is an enlarged view of a portion BB indicated by a dot-dash line in FIG. 6A.

Referring to FIGS. 6A and 6B, the display panel may include the substrate 100, a buffer layer 111, a pixel circuit layer PCL, a display element layer DEL, and a thin-film encapsulation layer TFE.

The buffer layer 111 may include an inorganic insulating material such as silicon nitride, silicon oxynitride, and silicon oxynitride, and include a single layer or a multi-layer including the inorganic insulating material.

The pixel circuit layer PCL may be arranged on the buffer layer 111. The pixel circuit layer PCL may include a thin-film transistor TFT, an inorganic insulating layer IIL, a first planarization layer 115, and a second planarization layer 116. The thin-film transistor TFT may be included in the pixel circuit PC, and the inorganic insulating layer IIL, the first planarization layer 115, and the second planarization layer 116 may be arranged under and/or on elements of the thin-film transistor TFT. The inorganic insulating layer IIL may include a first gate insulating layer 112, a second gate insulating layer 113, and an interlayer insulating layer 114.

The thin-film transistor TFT may include a semiconductor layer Act, and the semiconductor layer Act may include polycrystalline silicon. In an alternative embodiment, the semiconductor layer Act may include amorphous silicon, an oxide semiconductor, or an organic semiconductor. The semiconductor layer Act may include a channel region, a drain region, and a source region. The drain region and the source region may be respectively arranged on two opposite sides of the channel region. A gate electrode GE may overlap the channel region.

The gate electrode GE may include a low-resistance metal material. In an embodiment, the gate electrode GE may include a conductive material including at least one of molybdenum (Mo), aluminum (Al), copper (Cu), and titanium (Ti) and include a single layer or a multi-layer including the above material.

In an embodiment, the first gate insulating layer 112 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

In an embodiment, the second gate insulating layer 113 may cover the gate electrode GE. Similar to the first gate insulating layer 112, the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

A top electrode CE2 of the storage capacitor Cst may be arranged on the second gate insulating layer 113. The top electrode CE2 may overlap the gate electrode GE therebelow. In this case, the gate electrode GE and the top electrode CE2 overlapping each other with the second gate insulating layer 113 therebetween may constitute the storage capacitor Cst of the pixel circuit PC. That is, the gate electrode GE may serve as a bottom electrode CE1 of the storage capacitor Cst.

Likewise, the storage capacitor Cst and the thin-film transistor TFT may overlap each other. In an embodiment, the storage capacitor Cst may not overlap the thin-film transistor TFT.

The top electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and include a single layer or a multi-layer including the above materials.

The interlayer insulating layer 114 may cover the top electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 114 may include a single layer or a multi-layer including the above inorganic insulating material.

A drain electrode DE and a source electrode SE may be arranged on the interlayer insulating layer 114. The drain electrode DE and the source electrode SE may include a material having excellent conductivity. In an embodiment, the drain electrode DE and the source electrode SE may include a conductive material including at least one of molybdenum (Mo), aluminum (Al), copper (Cu), and titanium (Ti) and include a single layer or a multi-layer including the above material. In an embodiment, the drain electrode DE and the source electrode SE may have a multi-layered structure of Ti/Al/Ti.

The first planarization layer 115 may cover the drain electrode DE and the source electrode SE. The first planarization layer 115 may include an organic insulating layer. In an embodiment, the first planarization layer 115 may include an organic insulating material including a general-purpose polymer such as polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a combination thereof.

A first connection electrode CML1 may be arranged on the first planarization layer 115. In this case, the first connection electrode CML1 may be connected to the drain electrode DE or the source electrode SE through a contact hole of the first planarization layer 115. The first connection electrode CML1 may include a material having an excellent conductivity. In an embodiment, the first connection electrode CML1 may include a conductive material including at least one of molybdenum (Mo), aluminum (Al), copper (Cu), and titanium (Ti) and include a single layer or a multi-layer including the above material. In an embodiment, the first connection electrode CML1 may have a multi-layered structure of Ti/Al/Ti.

The second planarization layer 116 may cover the first connection electrode CML1. The second planarization layer 116 may include an organic insulating layer. In an embodiment, the second planarization layer 116 may include an organic insulating material including a general-purpose polymer such as PMMA or PS, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a combination thereof.

The display element layer DEL may be arranged on the pixel circuit layer PCL. The display element layer DEL may include an organic light-emitting diode OLED. A pixel electrode 211 of the organic light-emitting diode OLED may be electrically connected to the first connection electrode CML1 through a contact hole of the second planarization layer 116.

In an embodiment, the pixel electrode 211 may include a conductive oxide such as indium tin oxide ("ITO""), indium zinc oxide ("IZO"), zinc oxide (ZnO), indium oxide ($In_2O_3$), indium gallium oxide ("IGO"), or aluminum zinc oxide ("AZO"). In another embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a combination thereof. In another embodiment, the pixel electrode 211 may further include a layer including ITO, IZO, ZnO, or $In_2O_3$ on/under the reflective layer.

A pixel-defining layer 118 may be arranged on the pixel electrode 211. An opening 1180P that exposes the central portion of the pixel electrode 211 may be defined in the pixel-defining layer 118. The pixel-defining layer 118 may include an organic insulating material and/or an inorganic insulating material. The opening 1180P may define an emission area of light (also referred to as an emission area EA, hereinafter) emitted from the organic light-emitting diode OLED. In an embodiment, the width of the opening 1180P may correspond to the width of the emission area EA.

A spacer 119 may be arranged on the pixel-defining layer 118. The spacer 119 may be designed to prevent the substrate 100 from being destroyed in a method of manufacturing a display apparatus. In the method of manufacturing a display panel, a mask sheet may be used. In this case, the spacer 119 may prevent the damage to or the destruction of a portion of the substrate 100 by the mask sheet while the mask sheet enters the inside of the opening 1180P of the pixel-defining layer 118 or is closely attached to the pixel-defining layer 118 and a deposition material is deposited.

The spacer 119 may include an organic insulating material such as polyimide. In an alternative embodiment, the spacer 119 may include an inorganic insulating material such as silicon nitride or silicon oxide, or include an organic insulating material and an inorganic insulating material.

In an embodiment, the spacer 119 may include a material different from the pixel-defining layer 118. In an alternative embodiment, in another embodiment, the spacer 119 may include the same material as that of the pixel-defining layer 118. In this case, the pixel-defining layer 118 and the spacer 119 may be simultaneously provided during a mask process that uses a half-tone mask, etc.

An intermediate layer 212 may be arranged on the pixel-defining layer 118. The intermediate layer 212 may include an emission layer 212b arranged in the opening 1180P of the pixel-defining layer 118. The emission layer 212b may include a polymer or low-molecular weight organic material that emits light having a preset color.

A first functional layer 212a and a second functional layer 212c may be respectively arranged under and on the emission layer 212b. The first functional layer 212a may include, for example, a hole transport layer ("HTL"), or an HTL and a hole injection layer ("HIL"). The second functional layer 212c is an element arranged on the emission layer 212b and may be omitted. The second functional layer 212c may include an electron transparent layer ("ETL") and/or an electron injection layer ("EIL"). Like an opposite electrode 213 described below, the first functional layer 212a and/or the second functional layer 212c may be common layers that entirely cover the substrate 100.

The opposite electrode 213 may include a conductive material having a low-work function. In an embodiment, the opposite electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. In an alternative embodiment, the opposite electrode 213 may further include a layer including ITO, IZO, ZnO, or $In_2O_3$ on/under the (semi) transparent layer.

In an embodiment, a capping layer (not shown) may be further arranged on the opposite electrode 213. The capping layer may include lithium fluoride (LiF), and/or an organic material.

The thin-film encapsulation layer TFE may be arranged on the opposite electrode 213. In an embodiment, the thin-film encapsulation layer TFE includes at least one inorganic encapsulation layer and at least one organic encapsulation layer, and it is shown in FIG. 6A that the thin-film encapsulation layer TFE include a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may include at least one inorganic material from among aluminum oxide, titanium oxide, tantalum oxide, hafnium oxide, or zinc oxide, silicon oxide, silicon nitride, and silicon oxynitride. The organic encapsulation layer 320 may include a polymer-based material. The polymer-based material may include an acryl-based resin, an epoxy-based resin, polyimide, and polyethylene. In an embodiment, the organic encapsulation layer 320 may include acrylate.

Though not shown, a touch electrode layer may be arranged on the thin-film encapsulation layer TFE. An optical functional layer may be arranged on the touch electrode layer. The touch electrode layer may obtain coordinate information corresponding to an external input, for example, a touch event. The optical functional layer may reduce reflectivity of light (external light) incident toward the display apparatus from the outside, and/or improve color purity of light emitted from the display apparatus. In an embodiment, the optical functional layer may include a retarder and a polarizer. The retarder may include a film-type retarder or a liquid crystal-type retarder. The retarder may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. Each of the retarder and the polarizer may further include a protective film.

In another embodiment, the optical functional layer may include a black matrix and color filters. The color filters may be arranged by taking into account colors of pieces of light emitted respectively from the pixels of the display apparatus. The color filters may each include red, green, or blue pigment or dye. In an alternative embodiment, the color filters may each further include quantum dots in addition to the pigment or dye. In an alternative embodiment, some of the color filters may not include the pigment or dye and may include scattering particles such as titanium oxide.

In another embodiment, the optical functional layer may include a destructive interference structure. The destructive interference structure may include a first reflection layer and a second reflection layer respectively arranged in different layers. First-reflected light and second-reflected light respectively reflected by the first reflection layer and the second reflection layer may create destructive-interference and thus the reflectivity of external light may be reduced.

An adhesive member may be arranged between the touch electrode layer and the optical functional layer. For the adhesive member, a general member known in the art may be employed without limitation. The adhesive member may be a pressure sensitive adhesive ("PSA").

Figure 7A:
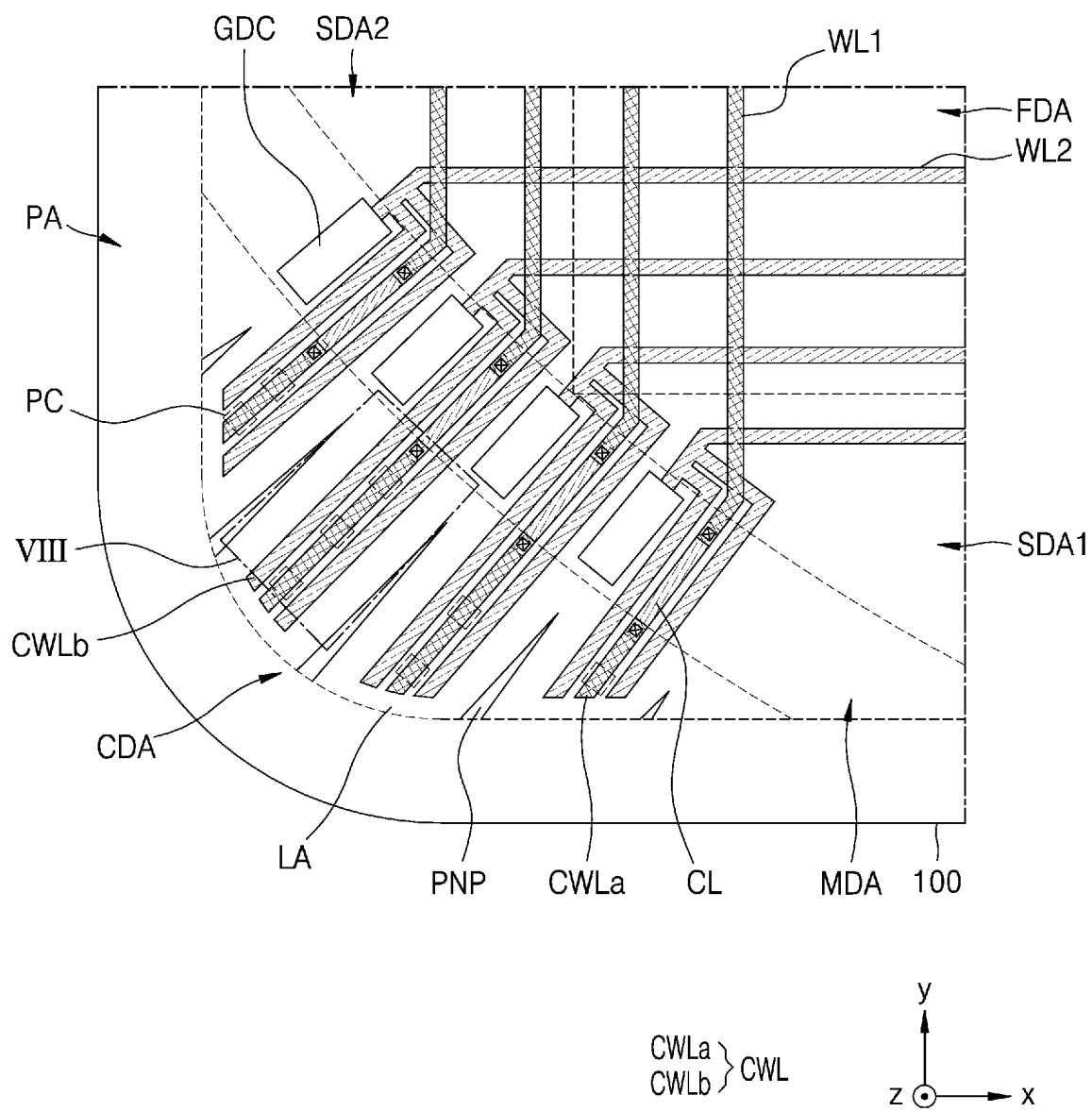
FIG. 7A is a plan view of an embodiment of a portion of a display panel.

FIG. 7A is a plan view of an embodiment of a portion of a display panel.

Referring to FIG. 7A, the display panel may include the substrate 100, the first wiring WL1, the second wiring WL2, a corner wiring CWL, and the pixel circuit PC. The corner wiring CWL may include a first corner wiring CWLa and a second corner wiring CWLb.

The substrate 100 may include the display area and the peripheral area PA. The display area may include the front display area FDA, the first side display area SDA1, the second side display area SDA2, and the corner display area CDA The first side display area SDA1 may be connected to the front display area FDA in the first direction (e.g. the y-direction or the (−) y-direction), the second side display area SDA2 may be connected to the front display area FDA in the second direction (e.g. the x-direction or the (−) x-direction), and the corner display area CDA may be arranged between the first side display area SDA1 and the second side display area SDA2 and may surround at least a portion of the front display area FDA. In addition, the display area may include the intermediate display area MDA between the front display area FDA and the corner display area CDA.

The first wiring WL1 and/or the second wiring WL2 may be arranged in one of the front display area FDA, the first side display area SDA1, and the second side display area SDA2. In an embodiment, the first wiring WL1 and the second wiring WL2 may be arranged in the front display area FDA. The first wiring WL1 may extend in the first direction (e.g. the y-direction or the (−) y-direction), and the second wiring WL2 may extend in the second direction (e.g. the x-direction or the (−) x-direction).

The gate driving circuit GDC may be arranged in the intermediate display area MDA. In this case, the gate driving circuit GDC may be arranged in plural along the extension direction of the intermediate display area MDA. In an embodiment, the plurality of gate driving circuits GDC may be spaced apart from each other.

The corner display area CDA may include the plurality of extension regions LA that extend in a direction away from the front display area FDA. In this case, the plurality of extension regions LA may extend from the intermediate display area MDA and include the space PNP between adjacent extension regions of the plurality of neighboring extension regions.

The extension regions LA may include a central region, a first outer region, and a second outer region. The first outer region and the second outer region may be arranged outside the central region. In this case, the central region, the first outer region and the second outer region may equally extend in the direction in which the extension regions LA extend. In addition, the pixel circuit PC may be arranged in the central region.

The first wiring WL1 may be arranged in the first direction (e.g. the y-direction or the (−) y-direction) in the front display area FDA. In addition, the first wiring WL1 may be arranged in the first direction (e.g. the y-direction or the (−) y-direction) also in at least one of the first side display area SDA1 and the second side display area SDA2. The first wiring WL1 may transfer a data signal to at least one of the first side display area SDA1, the second side display area SDA2, and the front display area FDA. In addition, the first wiring WL1 may be connected to the first corner wiring CWLa. The first wiring WL1 may be connected to the first corner wiring CWLa through a connection line CL.

In an embodiment, the first wiring WL1 and the connection line CL may be arranged in different layers. In an embodiment, an insulating layer may be arranged between the first wiring WL1 and the connection line CL. In this case, the first wiring WL1 may be connected to the connection line CL through a contact hole of the insulating layer.

The second wiring WL2 may be arranged in the second direction (e.g. the x-direction or the (−) x-direction) in the front display area FDA. In addition, the second wiring WL2 may be arranged in the second direction (e.g. the x-direction or the (−) x-direction) also in at least one of the first side display area SDA1 and the second side display area SDA2.

The second wiring WL2 may be connected to the gate driving circuit GDC. In an embodiment, the second wiring WL2 may extend in the second direction (e.g. the x-direction or the (−) x-direction) from the gate driving circuit GDC. Accordingly, the second wiring WL2 may transfer a scan signal or an emission control signal to at least one of the first side display area SDA1, the second side display area SDA2, and the front display area FDA. In addition, the second wiring WL2 may be connected to the second corner wiring CWLb.

The first corner wiring CWLa may be arranged in the corner display area CDA. The first corner wiring CWLa may extend in a direction intersecting the first direction (e.g. the y-direction or the (−) y-direction) and the second direction (e.g. the x-direction or the (−) x-direction) in the corner display area CDA. In this case, the first corner wiring CWLa may extend in a direction away from the front display area FDA.

The first corner wiring CWLa may be arranged in each of the plurality of extension regions LA. In this case, the first corner wiring CWLa may extend in the same direction as that of the extension direction of the extension regions LA. In an embodiment, the first corner wiring CWLa may overlap the pixel circuit PC. In another embodiment, the first corner wiring CWLa may be spaced apart from the pixel circuit PC. In this case, the first corner wiring CWLa may be arranged in at least one of the first outer region and the second outer region.

The first corner wiring CWLa may be connected to the first wiring WL1. The first corner wiring CWLa may be connected to the first wiring WL1 through the connection line CL. In an embodiment, the first corner wiring CWLa may be arranged in a layer different from the connection line CL. In an embodiment, an insulating layer may be arranged between the first corner wiring CWLa and the connection line CL. In this case, the first corner wiring CWLa may be connected to the connection line CL through a contact hole of the insulating layer. In an embodiment, the first corner wiring CWLa and the first wiring WL1 may be arranged in the same insulating layer.

The connection line CL may extend in a direction from the intermediate display area MDA to the corner display area CDA. In an embodiment, the connection line CL may be arranged between neighboring gate driving circuits GDC. Accordingly, the connection line CL may extend by passing through the neighboring gate driving circuits GDC.

The first corner wiring CWLa may be connected to the pixel circuit PC arranged in the plurality of extension regions LA. In an embodiment, in the case where the first corner wiring CWLa overlaps the pixel circuit PC, the first corner wiring CWLa may be directly connected to the pixel circuit PC. In another embodiment, in the case where the first corner wiring CWLa is spaced apart from the pixel circuit PC, the first corner wiring CWLa may be connected to the pixel circuit PC through a bridge line (not shown).

The first corner wiring CWLa may transfer a data signal to the pixel circuit PC arranged in the plurality of extension regions LA. The first corner wiring CWLa may transfer a data signal to the pixel circuit PC arranged in the plurality of extension regions LA. The data signal may be transferred through the first wiring WL1 and the connection line CL.

The second corner wiring CWLb may be arranged in the corner display area CDA. The second corner wiring CWLb may extend in a direction intersecting the first direction (e.g. the y-direction or the (−) y-direction) and the second direction (e.g. the x-direction or the (−) x-direction) in the corner display area CDA. In this case, the second corner wiring CWLb may extend in a direction away from the front display area FDA. The second corner wiring CWLb may extend in the same direction as that of the first corner wiring CWLa.

The second corner wiring CWLb may be arranged in each of the plurality of extension regions LA. In this case, the second corner wiring CWLb may extend in the same direction as that of the extension direction of the extension regions LA. In an embodiment, the second corner wiring CWLb may be spaced apart from the pixel circuit PC. In this case, the second corner wiring CWLb may be arranged in at least one of the first outer region and the second outer region. In another embodiment, the second corner wiring CWLb may overlap the pixel circuit PC.

The second corner wiring CWLb may be connected to the second wiring WL2. In addition, the second corner wiring CWLb may be connected to the gate driving circuit GDC. Accordingly, the second corner wiring CWLb may transfer a scan signal or an emission control signal.

The second corner wiring CWLb may pass through the intermediate display area MDA to extend to the corner display area CDA. In an embodiment, the second corner wiring CWLb may be arranged between neighboring gate driving circuits GDC. Accordingly, the second corner wiring CWLb may pass through the neighboring gate driving circuits GDC.

The second corner wiring CWLb may be connected to the pixel circuit PC arranged in the plurality of extension regions LA. In an embodiment, in the case where the second corner wiring CWLb is spaced apart from the pixel circuit PC, the second corner wiring CWLb may be connected to the pixel circuit PC through a bridge line (not shown). In another embodiment, in the case where the second corner wiring CWLb overlaps the pixel circuit PC, the second corner wiring CWLb may be directly connected to the pixel circuit PC.

In the illustrated embodiment, the first wiring WL1 may extend in the first direction (e.g. the y-direction or the (−) y-direction). The first wiring WL1 may transfer a data signal. In addition, the second wiring WL2 may extend in the second direction (e.g. the x-direction or the (−) x-direction). The second wiring WL2 may transfer a scan signal or an emission control signal. In the illustrated embodiment, the space PNP is provided between adjacent extension regions of the plurality of neighboring extension regions LA, and thus, the first wiring WL1 and the second wiring WL2 each may not extend in the first direction (e.g. the y-direction or the (−) y-direction) and the second direction (e.g. the x-direction or the (−) x-direction). Accordingly, the first corner wiring CWLa and the second corner wiring CWLb may extend in the extension direction of the plurality of extension regions LA to transfer a data signal, a scan signal, and/or an emission signal to the pixel circuit PC arranged in the plurality of extension regions LA.

Figure 7B:
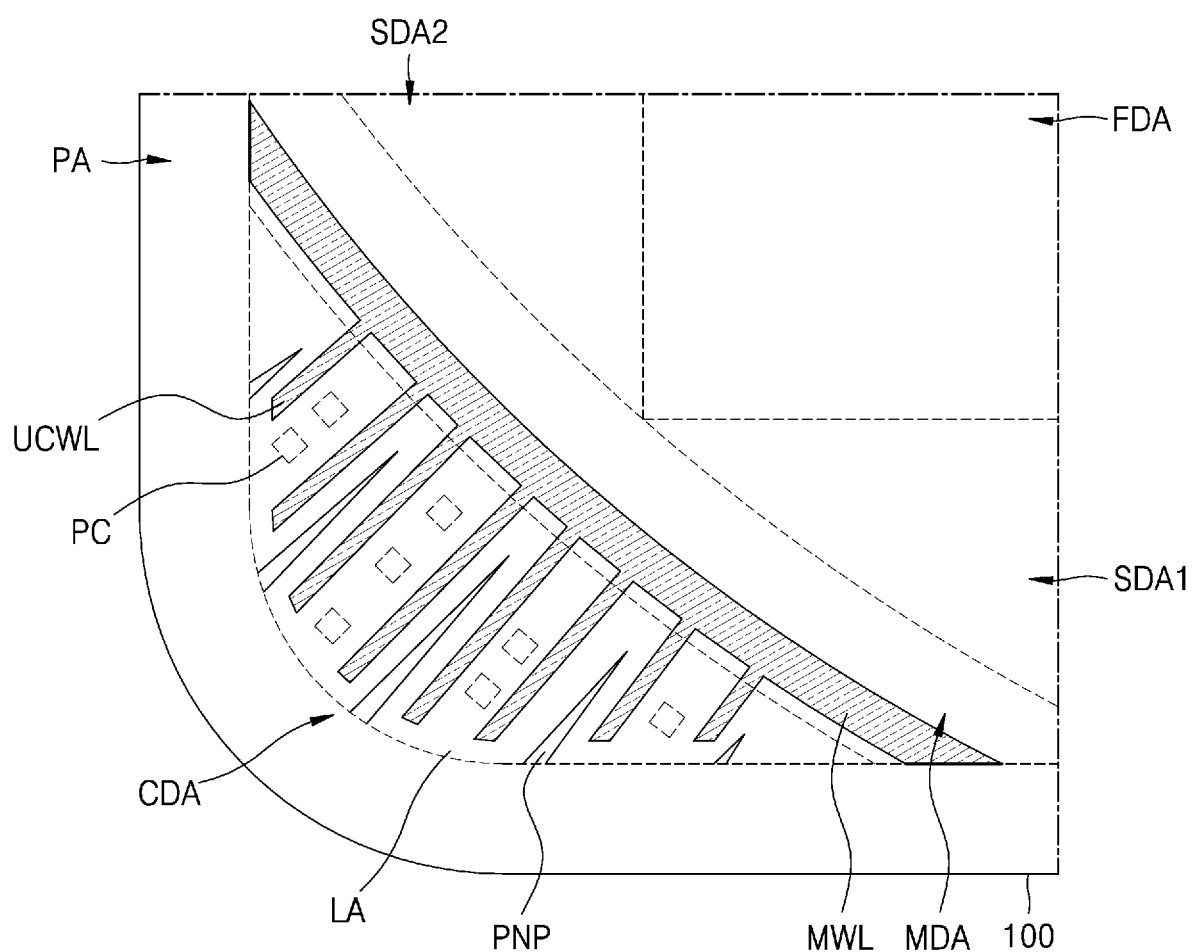
FIG. 7B is a plan view of an embodiment of a portion of a display panel.

FIG. 7B is a plan view of an embodiment of a portion of a display panel. In FIG. 7B, the same reference numerals as those of FIG. 7A denote the same members, and thus, repeated descriptions thereof are omitted.

Referring to FIG. 7B, the display panel may include the substrate 100, an intermediate wiring MWL, an upper connection line UCWL, and the pixel circuit PC.

The substrate 100 may include the front display area FDA, the first side display area SDA1, the second side display area SDA2, and the corner display area CDA. The first side display area SDA1 may be connected to the front display area FDA in the first direction (e.g. the y-direction or the (−) y-direction), the second side display area SDA2 may be connected to the front display area FDA in the second direction (e.g. the x-direction or the (−) x-direction), and the corner display area CDA may be arranged between the first side display area SDA1 and the second side display area SDA2 and may surround at least a portion of the front display area FDA. In addition, the intermediate display area MDA may be arranged between the front display area FDA and the corner display area CDA.

The corner display area CDA may include the plurality of extension regions LA that extend in a direction away from the front display area FDA. In this case, the plurality of extension regions LA may extend from the intermediate display area MDA. The space PNP may be provided between adjacent extension regions of the plurality of neighboring extension regions LA.

The extension regions LA may include a central region, a first outer region, and a second outer region. The first outer region and the second outer region may be arranged outside the central region. In this case, the central region, the first outer region and the second outer region may equally extend in the direction in which the extension regions LA extend. The pixel circuit PC may be arranged in the central region.

The intermediate wiring MWL may be arranged in the intermediate display area MDA. The intermediate wiring MWL may extend between the corner display area CDA and the front display area FDA. In an embodiment, the intermediate wiring MWL may be a power line. In an embodiment, the intermediate wiring MWL may supply the first power voltage ELVDD (refer to FIG. 3A) to the pixel circuit PC. In another embodiment, the intermediate wiring MWL may supply the second power voltage ELVSS (refer to FIG. 3A) to the pixel circuit PC. In another embodiment, the intermediate wiring MWL may supply the initialization voltage Vint (refer to FIG. 3B) to the pixel circuit PC.

The upper connection line UCWL may be arranged in the corner display area CDA. The upper connection line UCWL may extend in a direction intersecting the first direction (e.g. the y-direction or the (−) y-direction) and the second direction (e.g. the x-direction or the (−) x-direction) in the corner display area CDA. In this case, the upper connection line UCWL may extend in a direction away from the front display area FDA.

The upper connection line UCWL may be arranged in each of the plurality of extension regions LA. The upper connection line UCWL may extend in the same direction as that of the extension direction of the extension regions LA. In an embodiment, the upper connection line UCWL may overlap the pixel circuit PC. In another embodiment, the upper connection line UCWL may be spaced apart from the pixel circuit PC. In this case, the upper connection line UCWL may be arranged in at least one of the first outer region and the second outer region.

The upper connection line UCWL may be connected to the intermediate wiring MWL. In an embodiment, the upper connection line UCWL and the intermediate wiring MWL may be provided as one body. In another embodiment, the upper connection line UCWL and the intermediate wiring MWL may be arranged in different layers. In an embodiment, an insulating layer may be arranged between the upper connection line UCWL and the intermediate wiring MWL. In this case, the upper connection line UCWL may be connected to the intermediate wiring MWL through a contact hole of the insulating layer.

In an embodiment, the upper connection line UCWL may supply a power voltage to the pixel circuit PC arranged in the corner display area CDA. In an embodiment, the upper connection line UCWL may supply the first power voltage ELVDD (refer to FIG. 3A) to the pixel circuit PC arranged in the extension region LA. In another embodiment, the upper connection line UCWL may supply the second power voltage ELVSS (refer to FIG. 3A) to the pixel circuit PC arranged in the extension region LA. In another embodiment, the upper connection line UCWL may supply the initialization voltage (refer to FIG. 3B) to the pixel circuit PC arranged in the extension region LA.

Figure 8A:
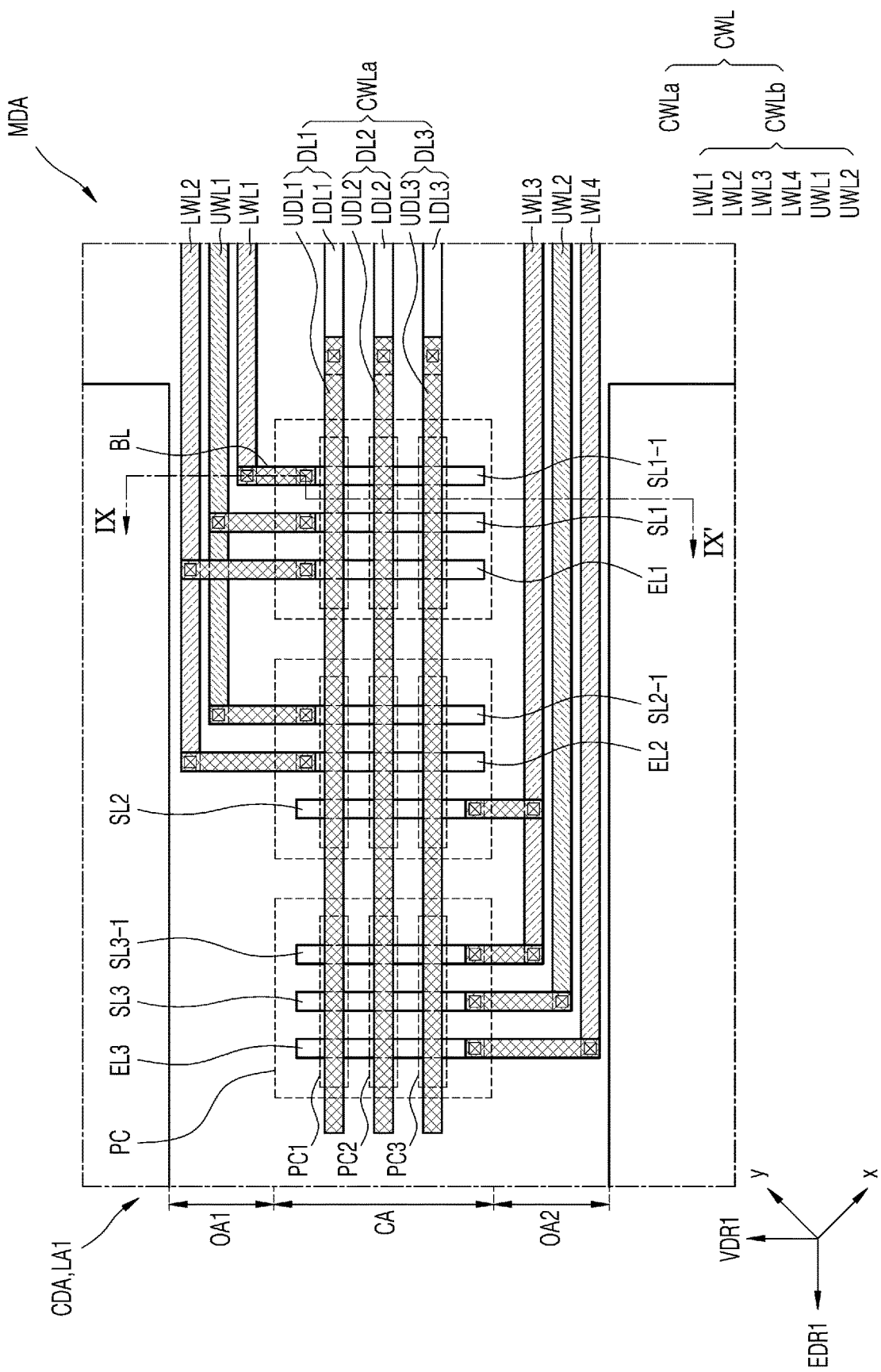
FIGS. 8A and 8B are plan views of an embodiment of a corner display area.
Figure 8B:
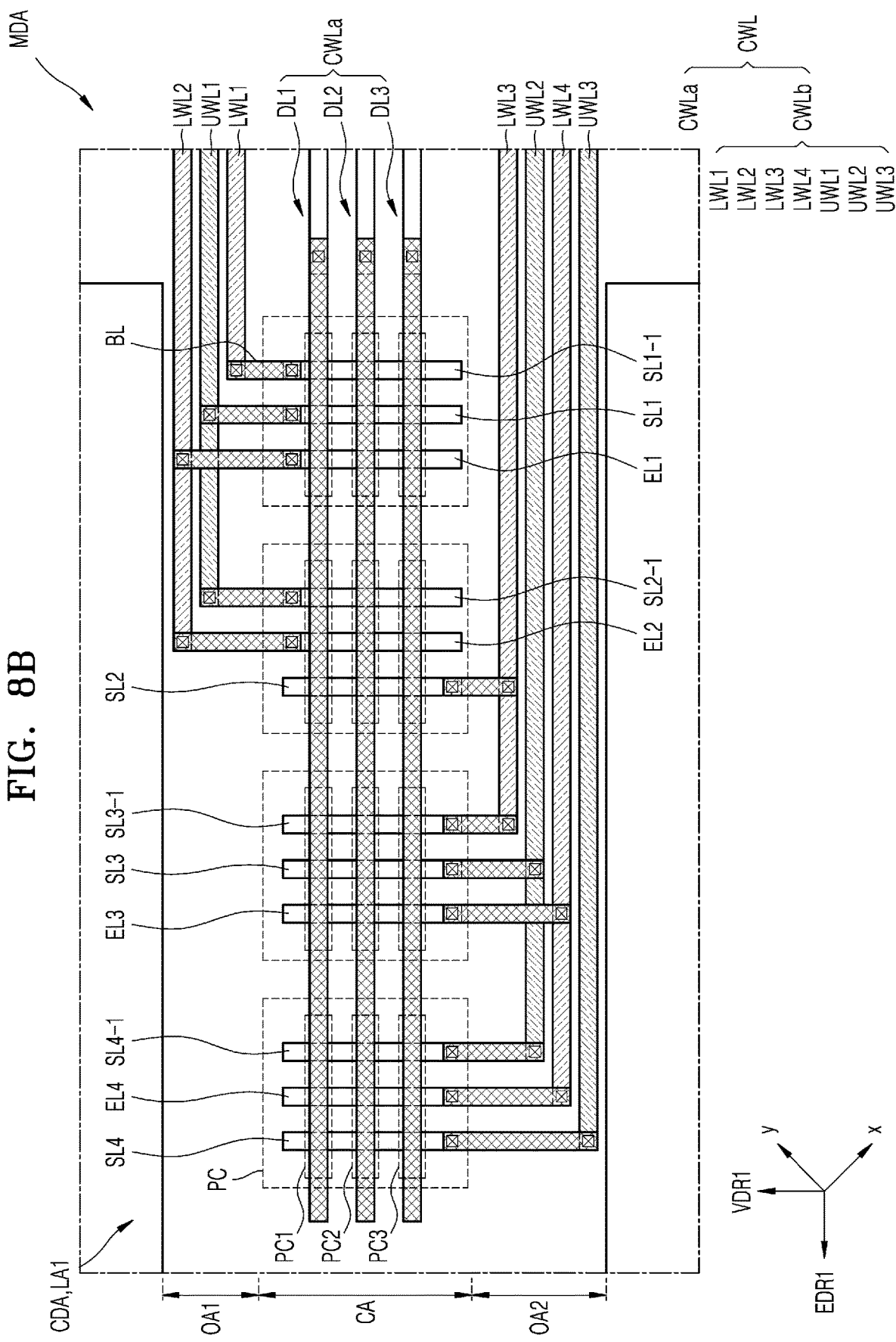

FIGS. 8A and 8B are plan views of an embodiment of the corner display area CDA. FIGS. 8A and 8B are enlarged views of a region VIII of FIG. 7A. In FIGS. 8A and 8B, the same reference numerals as those of FIG. 7 denote the same members, and thus, repeated descriptions thereof are omitted.

Referring to FIGS. 8A and 8B, the display panel may include a substrate, a first wiring, a second wiring, the corner wiring CWL, the pixel circuit PC, and a bridge line BL. The corner wiring CWL may include the first corner wiring CWLa and the second corner wiring CWLb.

The substrate may include a front display area, the corner display area CDA, and the intermediate display area MDA, the corner display area CDA surrounding the front display area. The intermediate display area MDA may be arranged between the front display area and the corner display area CDA. The corner display area CDA may include a plurality of extension regions that extend from the intermediate display area MDA. A space may be defined between adjacent extension regions of the plurality of extension regions. FIGS. 8A and 8B show a first extension region LA1 from among the plurality of extension regions.

The first extension region LA1 may extend in a first extension direction EDR1. In this case, the first extension direction EDR1 may be a direction intersecting the first direction (e.g. the y-direction or the (−) y-direction) and the second direction (e.g. the x-direction or the (−) x-direction). In an embodiment, the first extension direction EDR1 may form an acute angle with the first direction (e.g. the y-direction or the (−) y-direction). In another embodiment, the first extension direction EDR1 may form an obtuse angle or a right angle with the first direction (e.g. the y-direction or the (−) y-direction).

The first extension region LA1 may include a central region CA, a first outer region OA1, and a second outer region OA2. The first outer region OA1 and the second outer region OA2 may be respectively on two opposite sides of the central region CA. The central region CA may extend in the first extension direction EDR1. In addition, the central region CA may be arranged between the first outer region OA1 and the second outer region OA2.

The pixel circuit PC and the first corner wiring CWLa may be arranged in the central region CA. The pixel circuit PC may be arranged in plural in the first extension region LA1. In this case, the plurality of pixel circuits PC may be arranged side by side in the first extension direction EDR1.

In an embodiment, the pixel circuit PC may include a first pixel circuit PC1, a second pixel circuit PC2, and a third pixel circuit PC3. In an embodiment, the first pixel circuit PC1 may be connected to a display element that emits red light. The second pixel circuit PC2 may be connected to a display element that emits green light. The second pixel circuit PC3 may be connected to a display element that emits blue light. In another embodiment, the pixel circuit PC may include a fourth pixel circuit. The fourth pixel circuit may be connected to a display element that emits white light. Hereinafter, the case where the pixel circuit PC includes the first pixel circuit PC1, the second pixel circuit PC2, and the third pixel circuit PC3 is mainly described in detail.

The first pixel circuit PC1, the second pixel circuit PC2, and the third pixel circuit PC3 may be arranged side by side. In an embodiment, the first pixel circuit PC1, the second pixel circuit PC2, and the third pixel circuit PC3 may be arranged side by side in a first vertical direction VDR1 perpendicular to the first extension direction EDR1. In an embodiment, the first pixel circuit PC1 may be provided in plural in the first extension region LA1. The plurality of first pixel circuits PC1 may be arranged side by side in the first extension direction EDR1. The second pixel circuit PC2 may be provided in plural in the first extension region LA1. The plurality of second pixel circuits PC2 may be arranged side by side in the first extension direction EDR1. The third pixel circuit PC3 may be provided in plural in the first extension region LA1. The plurality of third pixel circuits PC3 may be arranged side by side in the first extension direction EDR1.

In the illustrated embodiment, the first corner wiring CWLa may extend in the first extension direction EDR1. The first corner wiring CWLa may overlap the pixel circuit PC. In addition, the first corner wiring CWLa may include a first data line DL1, a second data line DL2, and a third data line DL3 that extend side by side in the first extension direction EDR1.

The first data line DL1 may be connected to the first pixel circuit PC1. In an embodiment, the first data line DL1 may be connected to each of the plurality of first pixel circuits PC1. Accordingly, the plurality of first pixel circuits PC1 may be all connected to one first data line DL1.

In an embodiment, the first data line DL1 may include a first lower data line LDL1 and a first upper data line UDL1. The first lower data line LDL1 may be arranged in the intermediate display area MDA, and the first upper data line UDL1 may be arranged in the corner display area CDA. The first lower data line LDL1 and the first upper data line UDL1 may be arranged in different layers. In this case, the first upper data line UDL1 may be arranged on an insulating layer, and the first lower data line LDL1 may be arranged under the insulating layer. In this case, the first upper data line UDL1 may be connected to the first lower data line LDL1 through a contact hole of the insulating layer. In another embodiment, the first lower data line LDL1 may be omitted. In this case, the first upper data line UDL1 may extend to the intermediate display area MDA.

The second data line DL2 may be connected to the second pixel circuit PC2. In an embodiment, the second data line DL2 may be connected to each of the plurality of second pixel circuits PC2. Accordingly, the plurality of second pixel circuits PC2 may be all connected to one second data line DL2.

In an embodiment, the second data line DL2 may include a second lower data line LDL2 and a second upper data line UDL2. The second lower data line LDL2 may be arranged in the intermediate display area MDA, and the second upper data line UDL2 may be arranged in the corner display area CDA. The second lower data line LDL2 and the second upper data line UDL2 may be arranged in different layers. In this case, the second upper data line UDL2 may be arranged on an insulating layer, and the second lower data line LDL2 may be arranged under the insulating layer. In this case, the second upper data line UDL2 may be connected to the second lower data line LDL2 through a contact hole of the insulating layer. In another embodiment, the second lower data line LDL2 may be omitted. In this case, the second upper data line UDL2 may extend to the intermediate display area MDA.

The third data line DL3 may be connected to the third pixel circuit PC3. In an embodiment, the third data line DL3 may be connected to each of the plurality of third pixel circuits PC3. Accordingly, the plurality of third pixel circuits PC3 may be all connected to one third data line DL3.

In an embodiment, the third data line DL3 may include a third lower data line LDL3 and a third upper data line UDL3. The third lower data line LDL3 may be arranged in the intermediate display area MDA, and the third upper data line UDL3 may be arranged in the corner display area CDA. The third lower data line LDL3 and the third upper data line UDL3 may be arranged in different layers. In this case, the third upper data line UDL3 may be arranged on an insulating layer, and the third lower data line LDL3 may be arranged under the insulating layer. In this case, the third upper data line UDL3 may be connected to the third lower data line LDL3 through a contact hole of the insulating layer. In another embodiment, the third lower data line LDL3 may be omitted. In this case, the third upper data line UDL3 may extend to the intermediate display area MDA. In an embodiment, the first lower data line LDL1, the second lower data line LDL2, and the third lower data line LDL3 may be included in the connection line CL of FIG. 7A.

Accordingly, even when N pixel circuits PC are arranged in one first extension region LA1, three first corner wirings CWLa may be arranged.

In an embodiment, in the case where the pixel circuit PC further includes a fourth pixel circuits, the first corner wiring CWLa may further include a fourth data line. In this case, even when N pixel circuits PC are arranged in the first extension region LA1, four first corner wirings CWLa may be arranged.

The first outer region OA1 and the second outer region OA2 may extend to the first extension direction EDR1. The second corner wiring CWLb may be arranged in the first outer region OA1 and the second outer region OA2. The second corner wiring CWLb may extend in the first extension direction EDR1 and extend in the same direction as that of the first corner wiring CWLa. The second corner wiring CWLb may transfer a scan signal or an emission control signal to the pixel circuit PC.

The second corner wiring CWLb may include a lower wiring and an upper wiring arranged in different layers. In an embodiment, the lower wiring may be covered by an insulating layer, and the upper wiring may be arranged on the insulating layer.

In an embodiment, referring to FIG. 8A, three pixel circuits PC may be arranged in the first extension region LA1. In this case, the second corner wiring CWLb may include a first lower wiring LWL1, a second lower wiring LWL2, a third lower wiring LWL3, a fourth lower wiring LWL4, a first upper wiring UWL1, and a second upper wiring UWL2. In an embodiment, the first lower wiring LWL1, the second lower wiring LWL2, and the first upper wiring UWL1 may be arranged in the first outer region OA1. The third lower wiring LWL3, the fourth lower wiring LWL4, and the second upper wiring UWL2 may be arranged in the second outer region OA2.

The lower wirings and the upper wirings may be alternately arranged in the first vertical direction VDR1. In an embodiment, the first lower wiring LWL1, the first upper wiring UWL1, and the second lower wiring LWL2 may be sequentially arranged in the first vertical direction VDR1. In addition, the fourth lower wiring LWL4 and the second upper wiring UWL2, and the third lower wiring LWL3 may be sequentially arranged in the first vertical direction VDR1.

The second corner wiring CWLb includes the lower wiring and the upper wiring arranged in different layers and in at least one of the first outer region OA1 and the second outer region OA2, and thus the width of the first extension region LA1 may be reduced. In this case, the width of the first extension region LA1 is the width of the first extension region LA1 in the first vertical direction VDR1.

In the illustrated embodiment, the second corner wiring CWLb may be connected to the bridge line BL. Accordingly, the second corner wiring CWLb may be connected to the pixel circuit PC through the bridge line BL. In an embodiment, the second corner wiring CWLb and the bridge line BL may be arranged in different layers. In an embodiment, an insulating layer may be arranged on the second corner wiring CWLb. The bridge line BL may be arranged on the insulating layer. In this case, the second corner wiring CWLb may be connected to the bridge line BL through a contact hole of the insulating layer. In an embodiment, the bridge line BL may be arranged in the same layer as the first corner wiring CWLa. In an embodiment, the bridge line BL may be arranged in the same layer as the first upper data line UDL1.

In the illustrated embodiment, the second corner wiring CWLb may be connected to two of the plurality of pixel circuits PC. In an embodiment, a previous scan line and a scan line connected to neighboring pixel circuits PC may be connected to the same second corner wiring CWLb. In an embodiment, a first scan line SL1 and a second previous scan line SL2-1 respectively connected to neighboring pixel circuits PC may be connected to the first upper wiring UWL1 through the bridge line BL. In addition, a second scan line SL2 and a third previous scan line SL3-1 respectively connected to neighboring pixel circuits PC may be connected to the third lower wiring LWL3 through the bridge line BL.

In an embodiment, emission control lines connected to neighboring pixel circuits PC may be connected to the same second corner wiring CWLb. In an embodiment, a first emission control line EL1 and a second emission control line EL2 respectively connected to neighboring pixel circuits PC may be connected to the second lower wiring LWL2 through the bridge line BL.

In another embodiment, the emission control lines connected to the pixel circuits PC may each be connected to the same second corner wiring CWLb. Hereinafter, the case where the emission control lines connected to the neighboring pixel circuits PC are connected to the same second corner wiring CWLb is mainly described in detail.

In addition, a first previous scan line SL1-1 connected to the pixel circuit PC may be connected to the first lower wiring LWL1 through the bridge line BL. A third scan line SL3 connected to the pixel circuit PC may be connected to the second upper wiring UWL2 through the bridge line BL. A third emission control line EL3 connected to the pixel circuit PC may be connected to the fourth lower wiring LWL4. Accordingly, in the case where three pixel circuits PC are arranged in the first extension region LA1, a total of six second corner wirings CWLb may be used. As described above, in the case where N (N is an odd number) pixel circuits PC are arranged in the first extension region LA1, a total of (N+1)*1.5 second corner wirings CWLb may be used. As described above, the second corner wiring CWLb is connected to two of the plurality of pixel circuits PC, and thus, the number of wirings arranged in the first extension region LA1 may be reduced.

Referring to FIG. 8B, four pixel circuits PC may be arranged in the first extension region LA1. In this case, the second corner wiring CWLb may include the first lower wiring LWL1, the second lower wiring LWL2, the third lower wiring LWL3, the fourth lower wiring LWL4, the first upper wiring UWL1, the second upper wiring UWL2, and the third upper wiring UWL3. In an embodiment, the first lower wiring LWL1, the second lower wiring LWL2, and the first upper wiring UWL1 may be arranged in the first outer region OA1. The third lower wiring LWL3, the fourth lower wiring LWL4, the second upper wiring UWL2, and the third upper wiring UWL3 may be arranged in the second outer region OA2.

In the illustrated embodiment, the fourth lower wiring LWL4, the second upper wiring UWL2, the third lower wiring LWL3, and the third upper wiring UWL3 may be sequentially arranged in the first vertical direction VDR1.

In the illustrated embodiment, the second corner wiring CWLb may be connected to two of the plurality of pixel circuits PC. In an embodiment, a previous scan line and a scan line connected to neighboring pixel circuits PC may be connected to the same second corner wiring CWLb. In an embodiment, a first scan line SL1 and a second previous scan line SL2-1 respectively connected to neighboring pixel circuits PC may be connected to the first upper wiring UWL1 through the bridge line BL. In addition, a second scan line SL2 and a third previous scan line SL3-1 respectively connected to neighboring pixel circuits PC may be connected to the third lower wiring LWL3 through the bridge line BL. In addition, a third scan line SL3 and a fourth previous scan line SL4-1 respectively connected to neighboring pixel circuits PC may be connected to the second upper wiring UWL2 through the bridge line BL.

In an embodiment, emission control lines connected to neighboring pixel circuits PC may be connected to the same second corner wiring CWLb. In an embodiment, a first emission control line EL1 and a second emission control line EL2 respectively connected to neighboring pixel circuits PC may be connected to the second lower wiring LWL2 through the bridge line BL. In addition, the third emission control line EL3 and the fourth emission control line EL4 respectively connected to neighboring pixel circuits PC may be connected to the fourth lower wiring LWL4.

The first previous scan line SL1-1 connected to the pixel circuit PC may be connected to the first lower wiring LWL1 through the bridge line BL. The fourth scan line SL4 connected to the pixel circuit PC may be connected to the third upper wiring UWL3 through the bridge line BL. Accordingly, in the case where four pixel circuits PC are arranged in the first extension region LA1, a total of seven second corner wirings CWLb may be used. As described above, in the case where N (N is an even number) pixel circuits PC are arranged in the first extension region LA1, a total of 1.5*N+1 second corner wirings CWLb may be used. As described above, the second corner wiring CWLb is connected to two of the plurality of pixel circuits PC, and thus, the number of wirings arranged in the first extension region LA1 may be reduced.

Figure 9:
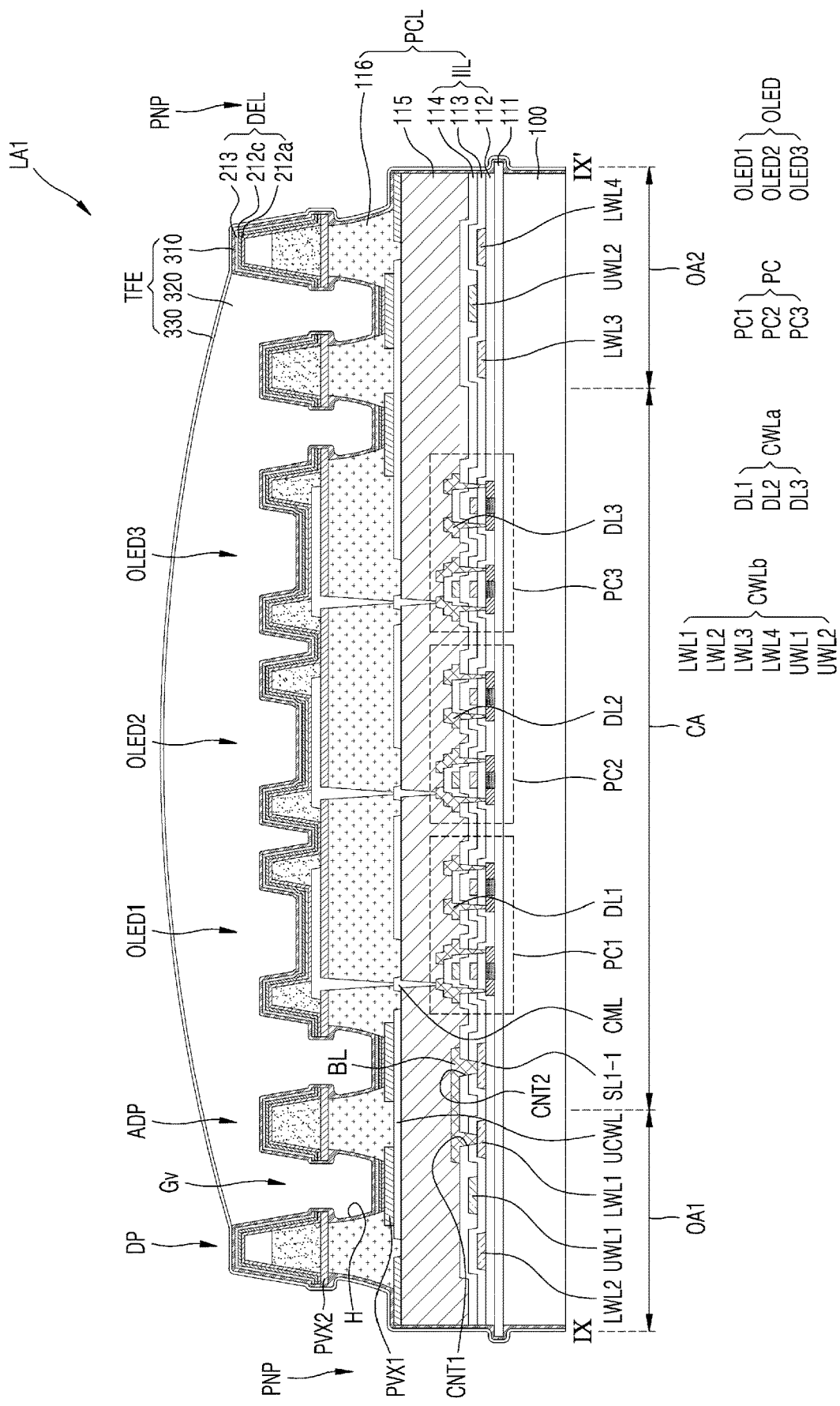
FIG. 9 is a cross-sectional view of an embodiment of a corner display area taken along line IX-IX' of FIG. 8A.

FIG. 9 is a cross-sectional view of the corner display area CDA taken along line IX-IX' of FIG. 8A. In FIG. 9, the same reference numerals as those of FIGS. 6A and 8A denote the same members, and thus, repeated descriptions thereof are omitted.

Referring to FIG. 9, the display panel may include the substrate 100, the buffer layer 111, the pixel circuit layer PCL, the display element layer DEL, and the thin-film encapsulation layer TFE.

The substrate 100 may include a corner display area, and the corner display area may include a plurality of extension regions. The space PNP may be defined between adjacent extension regions of the plurality of extension regions. The first extension region LA1 from among the plurality of extension regions may include the central region CA, the first outer region OA1, and the second outer region OA2. The first outer region OA1 and the second outer region OA2 may be respectively on two opposite sides of the central region CA.

The buffer layer 111, the pixel circuit layer PCL, the display element layer DEL, and the thin-film encapsulation layer TFE may be stacked on the substrate 100. The pixel circuit layer PCL may include the inorganic insulating layer IIL, the first corner wiring CWLa, the second corner wiring CWLb, the pixel circuit PC, the first planarization layer 115, and the second planarization layer 116. The inorganic insulating layer IIL may include the first gate insulating layer 112, the second gate insulating layer 113, and the interlayer insulating layer 114.

The first corner wiring CWLa may include the first data line DL1, the second data line DL2, and the third data line DL3. The second corner wiring CWLb may include the first lower wiring LWL1, the second lower wiring LWL2, the third lower wiring LWL3, the fourth lower wiring LWL4, the first upper wiring UWL1, and the second upper wiring UWL2.

The display element layer DEL may include an organic light-emitting diode OLED. In an embodiment, the display element layer DEL may include a first organic light-emitting diode OLED1, a second organic light-emitting diode OLED2, and a third organic light-emitting diode OLED3. The first organic light-emitting diode OLED1 may be connected to the first pixel circuit PC1, the second organic light-emitting diode OLED2 may be connected to the second pixel circuit PC2, and the third organic light-emitting diode OLED3 may be connected to the third pixel circuit PC3. The thin-film encapsulation layer TFE may include the first inorganic encapsulation layer 310, the organic encapsulation layer 320, and the second inorganic encapsulation layer 330.

A semiconductor layer of the first pixel circuit PC1, a semiconductor layer of the second pixel circuit PC2, and a semiconductor layer of the third pixel circuit PC3 may be arranged on the buffer layer 111. The first gate insulating layer 112 may cover the semiconductor layers.

The first previous scan line SL1-1, the first lower wiring LWL1, the second lower wiring LWL2, the third lower wiring LWL3, and the fourth lower wiring LWL4 may be arranged on the first gate insulating layer 112. In this case, the first lower wiring LWL1 and the second lower wiring LWL2 may be arranged on the first outer region OA1. The third lower wiring LWL3 and the fourth lower wiring LWL4 may be arranged on the second outer region In an embodiment, at least one of the first previous scan line SL1-1, the first lower wiring LWL1, the second lower wiring LWL2, the third lower wiring LWL3, and the fourth lower wiring LWL4 may include a conductive material including at least one of molybdenum (Mo), aluminum (Al), copper (Cu), and titanium (Ti) and include a single layer or a multi-layer including the above material. In an embodiment, at least one of the first previous scan line SL1-1, the first lower wiring LWL1, the second lower wiring LWL2, the third lower wiring LWL3, and the fourth lower wiring LWL4 may be simultaneously formed while the gate electrode GE of FIG. 6A is formed.

The second gate insulating layer 113 may cover the first lower wiring LWL1, the second lower wiring LWL2, the third lower wiring LWL3, and the fourth lower wiring LWL4. In addition, the first upper wiring UWL1 and the second upper wiring UWL2 may be arranged on the second gate insulating layer 113. In addition, the first lower wiring LWL1, the first upper wiring UWL1, and the second lower wiring LWL2 may be sequentially arranged in a direction from the central region CA to the first outer region OA1. In an embodiment, at least one of the first upper wiring UWL1 and the second upper wiring UWL2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and include a single layer or a multi-layer including the above materials. At least one of the first upper wiring UWL1 and the second upper wiring UWL2 may be simultaneously formed while the top electrode CE2 of FIG. 6A is formed.

The first upper wiring UWL1 may be arranged in a layer different from the first lower wiring LWL1 and the second lower wiring LWL2 to reduce the width of the first outer region OA1. Similar to this, the third lower wiring LWL3, the second upper wiring UWL2, and the fourth lower wiring LWL4 may be sequentially arranged in a direction from the central region CA to the second outer region OA2. The third lower wiring LWL3 and the fourth lower wiring LWL4 are arranged in a layer different from the second upper wiring UWL2, and thus, the width of the second outer region OA2 may be reduced.

The interlayer insulating layer 114 may cover the first upper wiring UWL1 and the second upper wiring UWL2. The first data line DL1, the second data line DL2, the third data line DL3, and the bridge line BL may be arranged on the interlayer insulating layer 114. In this case, the first data line DL1, the second data line DL2, the third data line DL3 may be respectively connected to the first pixel circuit PC1, the second pixel circuit PC2, and the third pixel circuit PC3. Accordingly, each data signal may be transferred to the first pixel circuit PC1, the second pixel circuit PC2, and the third pixel circuit PC3.

The second gate insulating layer 113 and the interlayer insulating layer 114 may include a first contact hole CNT1 and a second contact hole CNT2. The first contact hole CNT1 may expose the first lower wiring LWL1, and the second contact hole CNT2 may expose the first previous scan line SL1-1.

The bridge line BL may extend from at least one of the first outer region OA1 and the second outer region OA2 to the central region CA. In addition, the bridge line BL may be connected to the first lower wiring LWL1 and the first previous scan line SL1-1 through the first contact hole CNT1 and the second contact hole CNT2. Accordingly, a previous scan signal may be transferred to the first previous scan line SL1-1 from the gate driving circuit arranged in the intermediate display area through the first lower wiring LWL1 and the bridge line BL.

In an embodiment, at least one of the first data line DL1, the second data line DL2, the third data line DL3, and the bridge line BL may include a conductive material including at least one of molybdenum (Mo), aluminum (Al), copper (Cu), and titanium (Ti) and include a single layer or a multi-layer including the above material. At least one of the first data line DL1, the second data line DL2, the third data line DL3, and the bridge line BL may have a multi-layered structure of Ti/Al/Ti. At least one of the first data line DL1, the second data line DL2, the third data line DL3, and the bridge line BL may be simultaneously formed while the drain electrode DE and the source electrode SE of FIG. 6A are formed.

Though not shown, the first scan line and the first emission control line may be connected to the first pixel circuit PC1, the second pixel circuit PC2, and the third pixel circuit PC3. The first scan line and the first emission control line may transfer a scan signal and an emission control signal to the first pixel circuit PC1, the second pixel circuit PC2, and the third pixel circuit PC3. In this case, the first upper wiring UWL1 may be connected to the first scan line to transfer a scan signal to the pixel circuit PC. Similar to this, the second lower wiring LWL2 may be connected to the first emission control line to transfer an emission control signal to the pixel circuit PC. Accordingly, in an embodiment, even though the space PNP is defined between adjacent extension regions of the plurality of neighboring extension regions, a signal may be transferred to the pixel circuit PC.

The first planarization layer 115 may be arranged on the first corner wiring CWLa and the bridge line BL. A connection electrode CML and the upper connection line UCWL may be arranged on the first planarization layer 115. The connection electrode CML may connect the pixel circuit PC to the organic light-emitting diode OLED. Similar to the first corner wiring CWLa and/or the second corner wiring CWLb, the upper connection line UCWL may extend from the intermediate display area to the corner display area. The upper connection line UCWL may transfer the initialization voltage Vint (refer to FIG. 3B), the first power voltage ELVDD (refer to FIG. 3B), and/or the second power voltage ELVSS (refer to FIG. 3B) to the pixel circuit PC. In an embodiment, the upper connection line UCWL may be arranged between the interlayer insulating layer 114 and the first planarization layer 115.

In an embodiment, the upper connection line UCWL may include a conductive material including at least one of molybdenum (Mo), aluminum (Al), copper (Cu), and titanium (Ti) and include a single layer or a multi-layer including the above material. In an embodiment, the upper connection line UCWL may have a multi-layered structure of Ti/Al/Ti.

A lower inorganic pattern layer PVX1 may be arranged on the first planarization layer 115 and/or the upper connection line UCWL. The lower inorganic pattern layer PVX1 may be arranged in plural on the upper connection line UCWL. The plurality of lower inorganic pattern layers PVX1 may be spaced apart from each other on the upper connection line UCWL.

The second planarization layer 116 may cover the upper connection line UCWL, the connection electrode CML, and the first planarization layer 115. In an embodiment, a groove Gv may be defined in the second planarization layer 116. A hole H may be defined in the second planarization layer 116. The hole H may correspond to the lower inorganic pattern layer PVX1. In addition, the second planarization layer 116 may cover the edge of the lower inorganic pattern layer PVX1. Accordingly, the groove Gv may be defined by the central portion of the lower inorganic pattern layer PVX1 and the hole H of the second planarization layer 116. The groove Gv may control the flow of an organic material of the organic encapsulation layer 320 while the organic encapsulation layer 320 is formed.

An inorganic pattern layer PVX2 and the organic light-emitting diode OLED may be arranged on the second planarization layer 116. The inorganic pattern layer PVX2 is arranged on two opposite sides of the groove Gv and may include a pair of protrusion tips protruding in a central direction of the groove Gv. In an embodiment, the organic light-emitting diode OLED may overlap the pixel circuit PC. In an embodiment, the first organic light-emitting diode OLED1, the second organic light-emitting diode OLED2, and the third organic light-emitting diode OLED3 may respectively overlap the first pixel circuit PC1, the second pixel circuit PC2, and the third pixel circuit PC3. In another embodiment, at least one of the first organic light-emitting diode OLED1, the second organic light-emitting diode OLED2, and the third organic light-emitting diode OLED3 may not overlap the pixel circuit PC.

The first functional layer 212a, the second functional layer 212c, and the opposite electrode 213 arranged on the inorganic pattern layer PVX2 may be disconnected by the groove Gv and a pair of protrusion tips. In an embodiment, a first functional layer pattern, a second functional layer pattern, and an opposite electrode pattern may be arranged inside the groove Gv.

A dam portion DP and an auxiliary dam portion ADP each protruding in a thickness direction of the substrate 100 may be provided on the inorganic pattern layer PVX2. The auxiliary dam portion ADP may be arranged between the dam portion DP and the organic light-emitting diode OLED.

In an embodiment, the groove Gv may be arranged between the dam portion DP and the auxiliary dam portion ADP. The groove Gv may be arranged between the auxiliary dam portion ADP and the organic light-emitting diode OLED.

In an embodiment, a height from the top surface of the substrate 100 to the top surface of the dam portion DP may be higher than a height from the top surface of the substrate 100 to the top surface of the auxiliary dam portion ADP.

In an embodiment, the first inorganic encapsulation layer 310 may entirely and continuously cover the first extension region LA1. In an embodiment, the first inorganic encapsulation layer 310 may entirely and continuously cover the dam portion DP, the auxiliary dam portion ADP, the groove Gv, and the organic light-emitting diode OLED. In this case, the first inorganic encapsulation layer 310 may contact the inorganic pattern layer PVX2. The organic encapsulation layer 320 may extend from the organic light-emitting diode OLED to the dam portion DP. In this case, the organic encapsulation layer 320 may fill the groove Gv. Like the first inorganic encapsulation layer 310, the second inorganic encapsulation layer 330 may entirely and continuously cover the first extension region LA1. In an embodiment, the second inorganic encapsulation layer 330 may contact the first inorganic encapsulation layer 310 in the dam portion DP.

Figure 10:
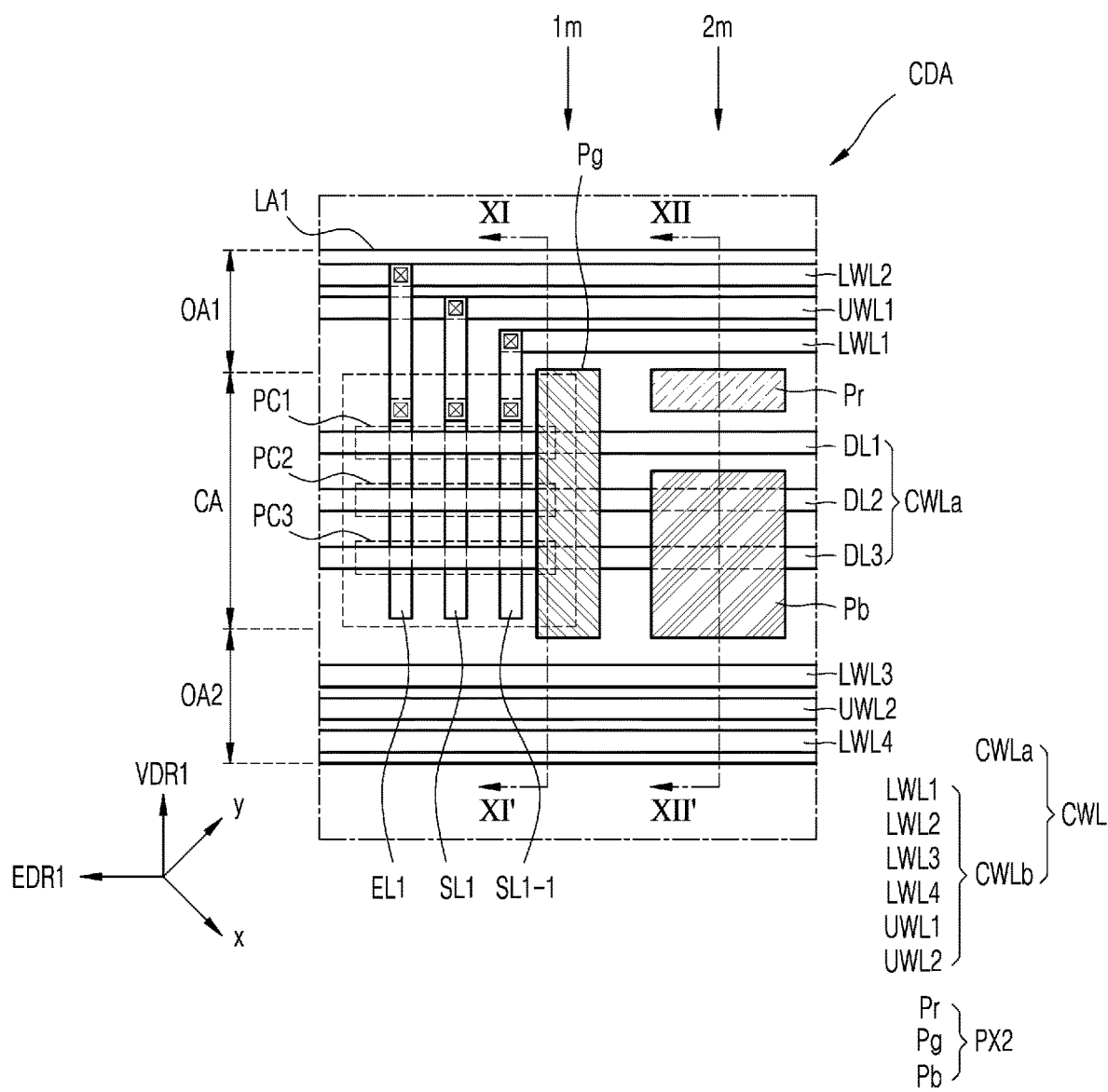
FIG. 10 is a plan view of an embodiment of a portion of a corner display area.

FIG. 10 is a plan view of an embodiment of a portion of a corner display area CDA. In FIG. 10, the same reference numerals as those of FIG. 8A denote the same members, and thus, repeated descriptions thereof are omitted.

Referring to FIG. 10, the display panel may include a substrate, the corner wiring CWL, the pixel circuit PC, the bridge line BL, and the second pixel PX2. The corner wiring CWL may include the first corner wiring CWLa and the second corner wiring CWLb.

The corner display area CDA may include a plurality of extension regions that extend from the intermediate display area. A space may be defined between adjacent extension regions of the plurality of extension regions. FIG. 10 is a plan view of a portion of the first extension region LA1 extending in the first extension direction EDR1 from among the plurality of extension regions.

The first extension region LA1 may include a central region CA, a first outer region OA1, and a second outer region OA2. The first outer region OA1 and the second outer region OA2 may be respectively on two opposite sides of the central region CA. The central region CA may extend in the first extension direction EDR1. In addition, the central region CA may be arranged between the first outer region OA1 and the second outer region OA2.

The pixel circuit PC and the first corner wiring CWLa may be arranged in the central region CA. The pixel circuit PC may include the first pixel circuit PC1, the second pixel circuit PC2, and the third pixel circuit PC3. The first corner wiring CWLa may include the first data line DL1, the second data line DL2, and the third data line DL3.

The second pixel PX2 may include sub-pixels. A sub-pixel is a display element and may emit light having a preset color by an organic light-emitting diode. In an embodiment, a sub-pixel is a minimum unit that implements an image and denotes an emission area. In the case where an organic light-emitting diode is employed as a display element, the emission area may be defined by an opening of a pixel-defining layer.

The second pixel PX2 may include a red sub-pixel Pr, a green sub-pixel Pg, and a blue sub-pixel Pb. A display element of the red sub-pixel Pr may be connected to the first pixel circuit PC1. A display element of the green sub-pixel Pg may be connected to the second pixel circuit PC2. A display element of the blue sub-pixel Pb may be connected to the third pixel circuit PC3. In an embodiment, the red sub-pixel Pr, the green sub-pixel Pg, and the blue sub-pixel Pb may be arranged in the central region CA. In an embodiment, the red sub-pixel Pr, the green sub-pixel Pg, and the blue sub-pixel Pb may overlap the central region CA and at least one of the first outer region OA1 and the second outer region OA2.

The red sub-pixel Pr, the green sub-pixel Pg, and the blue sub-pixel Pb may be arranged in the first extension region LA1. The red sub-pixel Pr, the green sub-pixel Pg, and the blue sub-pixel Pb may respectively emit red light, green light, and blue light. The red sub-pixel Pr, the green sub-pixel Pg, and the blue sub-pixel Pb may be provided in an S-stripe structure.

The green sub-pixel Pg may be arranged in a first column 1m, the red sub-pixel Pr and the blue sub-pixel Pb may be arranged in a neighboring second column 2m. In this case, the green sub-pixels Pg may be arranged in a quadrangular shape including a long side in the first vertical direction VDR1. Red sub-pixels Pr and the blue sub-pixels Pb may be arranged in a quadrangular shape. In other words, a side of the red sub-pixel Pr and a side of the blue sub-pixel Pb may be arranged to face the long sides of the green sub-pixel Pg. In an embodiment, the length of the side of the red sub-pixel Pr in the first vertical direction VDR1 perpendicular to the first extension direction EDR1 may be less than the length of the side of the blue sub-pixel Pb in the first vertical direction VDR1.

Figure 11:
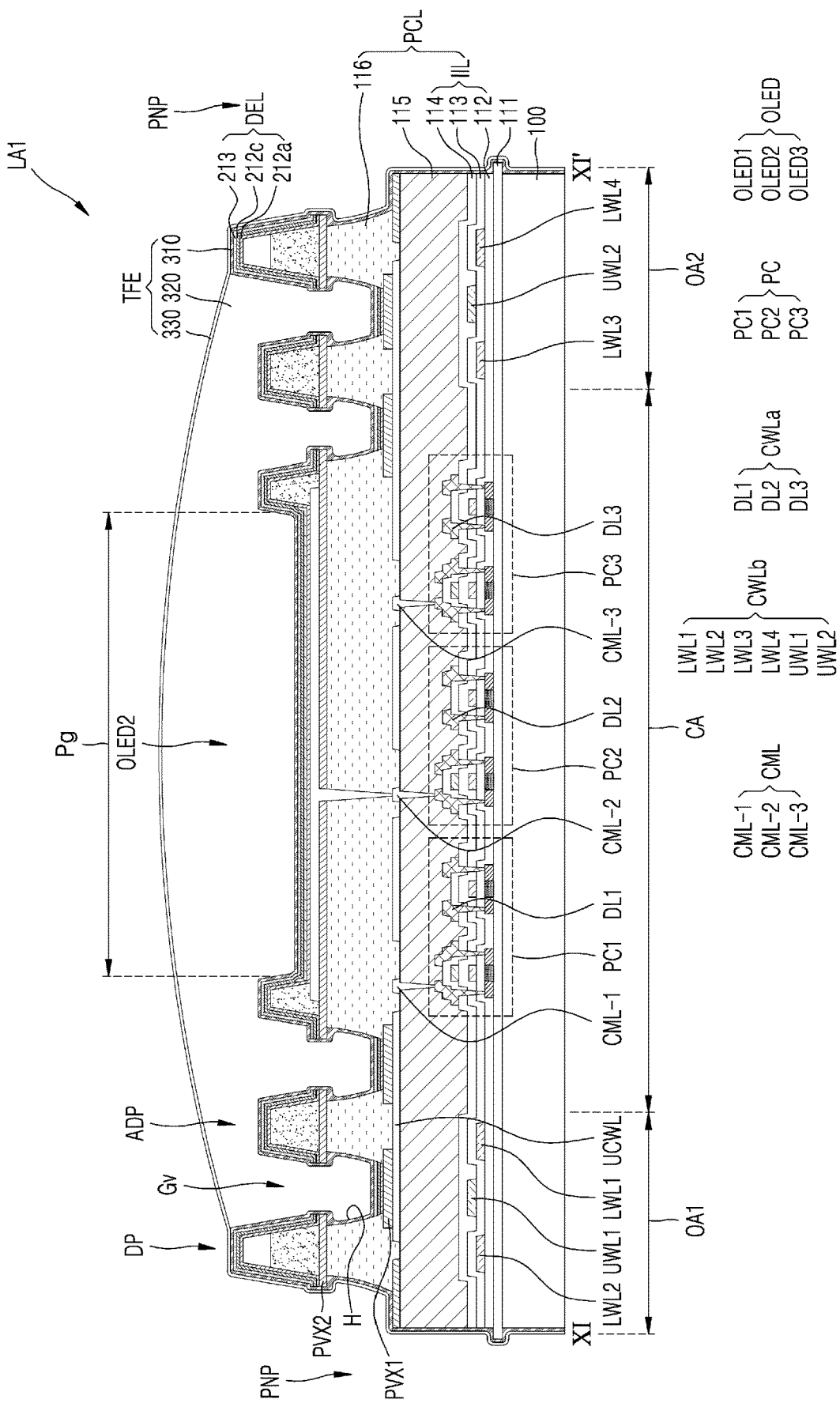
FIG. 11 is a cross-sectional view of an embodiment of a display panel taken along line XI-XI' of FIG. 10.
Figure 12:
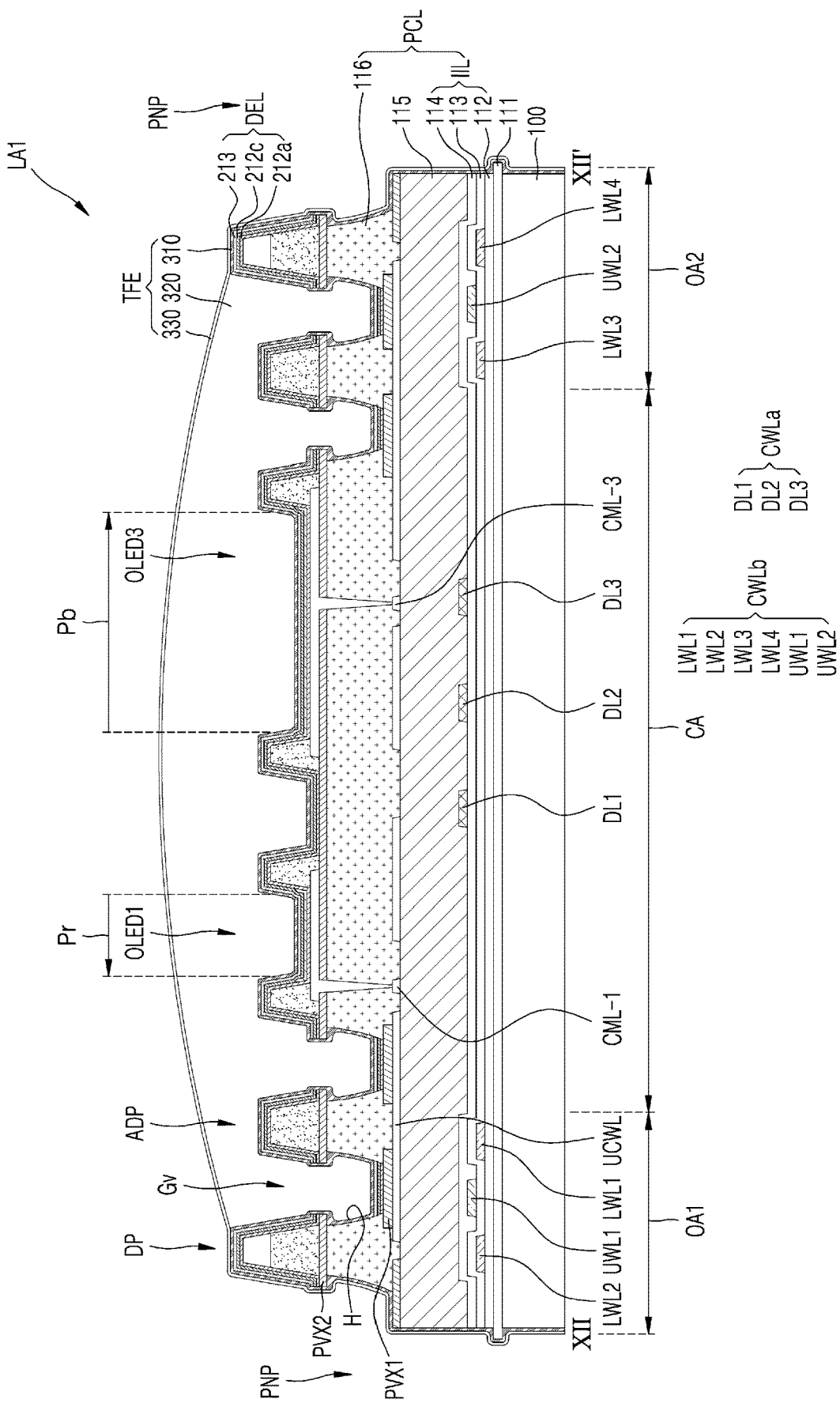
FIG. 12 is a cross-sectional view of an embodiment of the display panel taken along line XII-XII' of FIG. 10.

FIG. 11 is a cross-sectional view of a display panel taken along line XI-XI' of FIG. 10. FIG. 12 is a cross-sectional view of the display panel taken along line XII-XII' of FIG. 10. In FIGS. 11 and 12, the same reference numerals as those of FIG. 9 denote the same members, and thus, repeated descriptions thereof are omitted.

Referring to FIGS. 11 and 12, the display panel may include the substrate 100, the buffer layer 111, the pixel circuit layer PCL, the display element layer DEL, and the thin-film encapsulation layer TFE.

The substrate 100 may include a corner display area, and the corner display area may include a plurality of extension regions. The space PNP may be defined between adjacent extension regions of the plurality of extension regions. The first extension region LA1 from among the plurality of extension regions may include the central region CA, the first outer region OA1, and the second outer region OA2. The first outer region OA1 and the second outer region OA2 may be respectively on two opposite sides of the central region CA.

The buffer layer 111, the pixel circuit layer PCL, the display element layer DEL, and the thin-film encapsulation layer TFE may be stacked on the substrate 100. The pixel circuit layer PCL may include the inorganic insulating layer IIL, the first corner wiring CWLa, the second corner wiring CWLb, the pixel circuit PC, the first planarization layer 115, the connection electrode CML, and the second planarization layer 116. The inorganic insulating layer IIL may include the first gate insulating layer 112, the second gate insulating layer 113, and the interlayer insulating layer 114.

The first corner wiring CWLa may include the first data line DL1, the second data line DL2, and the third data line DL3. The second corner wiring CWLb may include the first lower wiring LWL1, the second lower wiring LWL2, the third lower wiring LWL3, the fourth lower wiring LWL4, the first upper wiring UWL1, and the second upper wiring UWL2.

The pixel circuit PC may include the first pixel circuit PC1, the second pixel circuit PC2, and the third pixel circuit PC3. The connection electrode CML may be arranged between the first planarization layer 115 and the second planarization layer 116. The connection electrode CML may include a first electrode pattern CML-1, a second electrode pattern CML-2, and a third electrode pattern CML-3. The first electrode pattern CML-1 may be connected to the first pixel circuit PC1. The second electrode pattern CML-2 may be connected to the second pixel circuit PC2. The third electrode pattern CML-3 may be connected to the third pixel circuit PC3.

The display element layer DEL may be arranged on the pixel circuit layer PCL. The display element layer DEL may include the first organic light-emitting diode OLED1, the second organic light-emitting diode OLED2, and the third organic light-emitting diode OLED3. The first organic light-emitting diode OLED1 may emit red light. An emission area of the first organic light-emitting diode OLED1 may be defined as a red sub-pixel Pr. The first organic light-emitting diode OLED1 may be electrically connected to the first pixel circuit PC1 through the first electrode pattern CML-1. The second organic light-emitting diode OLED2 may emit green light. An emission area of the second organic light-emitting diode OLED2 may be defined as a green sub-pixel Pg. The second organic light-emitting diode OLED2 may be electrically connected to the second pixel circuit PC2 through the second electrode pattern CML-2. The third organic light-emitting diode OLED3 may emit blue light. An emission area of the third organic light-emitting diode OLED3 may be defined as a blue sub-pixel Pb. The third organic light-emitting diode OLED3 may be electrically connected to the third pixel circuit PC3 through the third electrode pattern CML-3.

Figure 13:
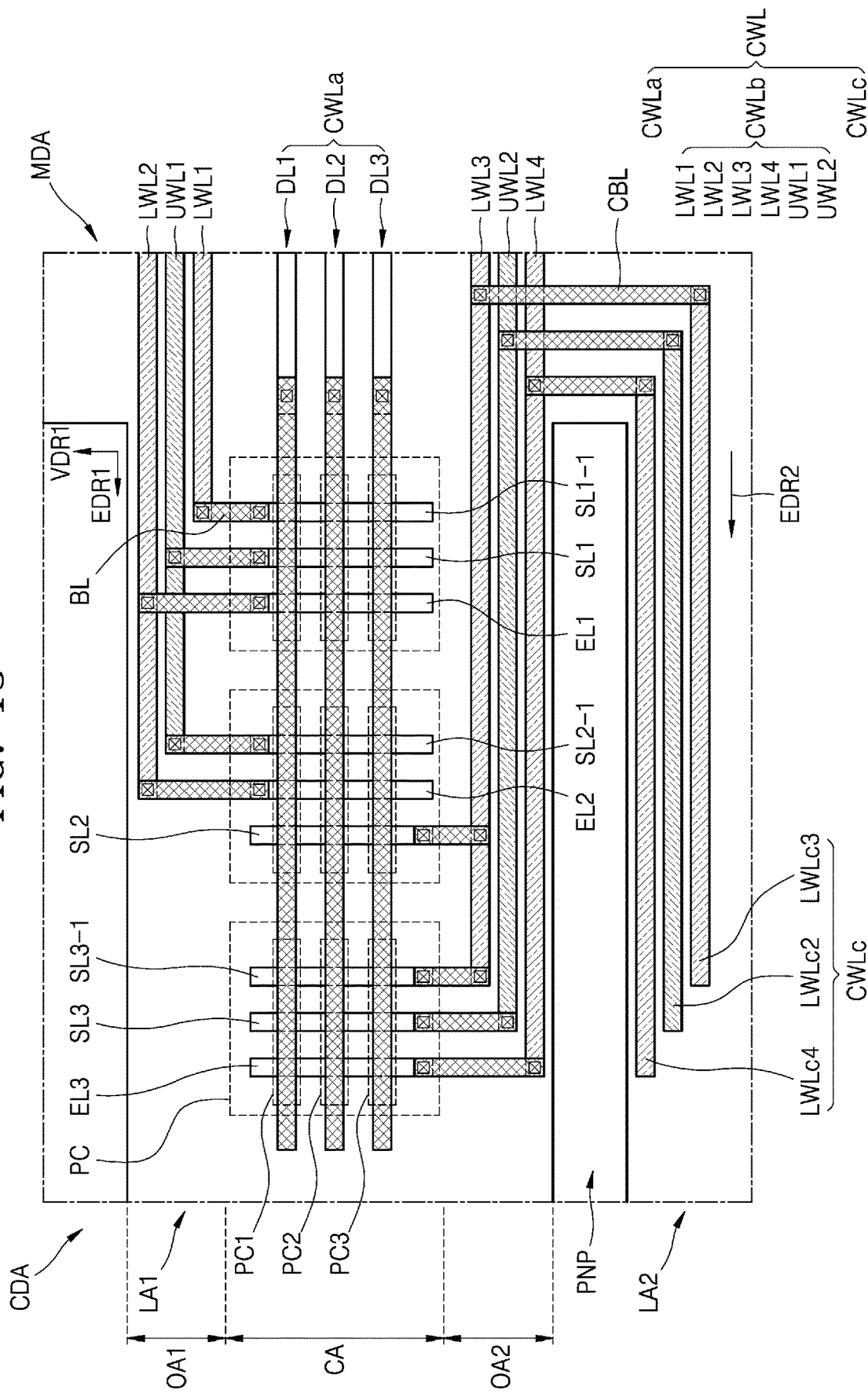
FIG. 13 is a plan view of another embodiment of a corner display area.

FIG. 13 is a plan view of another embodiment of the corner display area CDA. In FIG. 13, the same reference numerals as those of FIG. 8A denote the same members, and thus, repeated descriptions thereof are omitted.

Referring to FIG. 13, the display panel may include a substrate, a first wiring, a second wiring, the corner wiring CWL, the pixel circuit PC, and the bridge line BL. The corner wiring CWL may include the first corner wiring CWLa and the second corner wiring CWLb. In this case, the first corner wiring CWLa and the second corner wiring CWLb may extend in the first extension direction EDR1.

The substrate may include a front display area, the corner display area CDA, and the intermediate display area MDA, the corner display area CDA surrounding the front display area. The intermediate display area MDA may be arranged between the front display area and the corner display area CDA. The corner display area CDA may include a plurality of extension regions that extend from the intermediate display area MDA. A space PNP may be defined between adjacent extension regions of the plurality of extension regions.

The plurality of extension regions may include the first extension region LA1 and the second extension region LA2. The second extension region LA2 may neighbor the first extension region LA1 and extend in a second extension direction EDR2. The second extension direction EDR2 may be a direction intersecting the first direction (e.g. the y-direction or the (−) y-direction) and the second direction (e.g. the x-direction or the (−) x-direction).

The corner wiring CWL may further include a third corner wiring CWLc that extends in the second extension direction EDR2 from the second extension region LA2. The third corner wiring CWLc may be connected to the second corner wiring CWLb. In this case, the third corner wiring CWLc may be connected to the second corner wiring CWLb through a connection bridge line CBL. The connection bridge line CBL is similar to the bridge line BL, and thus, detailed description thereof is omitted. In an embodiment, the connection bridge line CBL is arranged in the same layer as the bridge line BL.

In an embodiment, the third corner wiring CWLc may include a third lower connection line LWLc3, a second upper connection line UWLc2, and a fourth lower connection line LWLc4. The third lower connection line LWLc3, the second upper connection line UWLc2, and the fourth lower connection line LWLc4 may be respectively connected to the third lower wiring LWL3, the second upper wiring UWL2, and the fourth lower wiring LWL4. The third lower connection line LWLc3, the second upper connection line UWLc2, and the fourth lower connection line LWLc4 are respectively similar to the third lower wiring LWL3, the second upper wiring UWL2, and the fourth lower wiring LWL4, and thus, detailed descriptions thereof are omitted.

In the illustrated embodiment, the second corner wiring CWLb and the third corner wiring CWLc may transfer a signal generated by one gate driving circuit to the pixel circuit PC arranged in neighboring first extension region LA1 and second extension region LA2.

Figure 14:
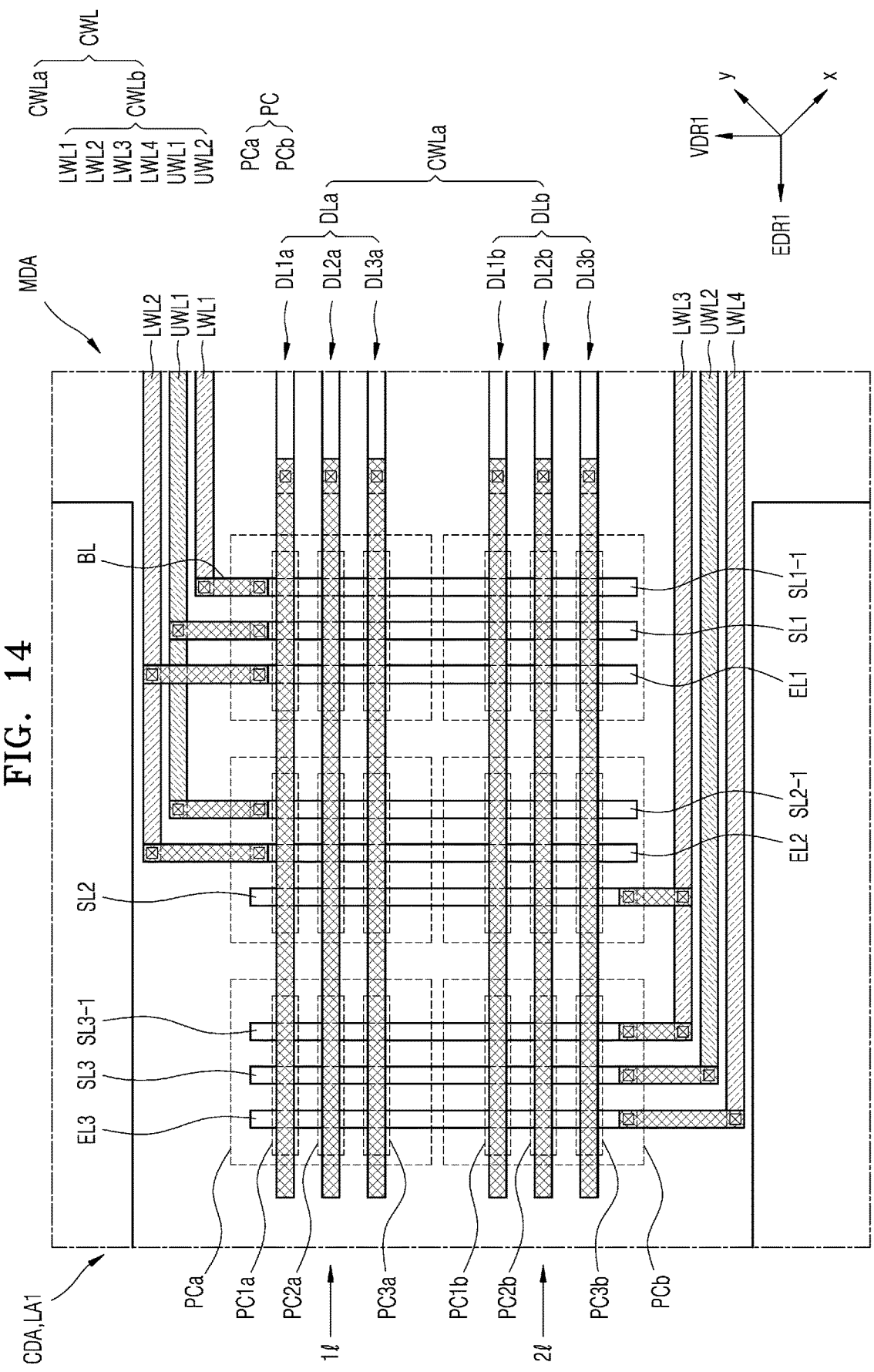
FIG. 14 is a plan view of another embodiment of a corner display area.

FIG. 14 is a plan view of an embodiment of the corner display area CDA. In FIG. 14, the same reference numerals as those of FIG. 8A denote the same members, and thus, repeated descriptions thereof are omitted.

Referring to FIG. 14, the display panel may include a substrate, a first wiring, a second wiring, the corner wiring CWL, the pixel circuit PC, and the bridge line BL. The corner wiring CWL may include the first corner wiring CWLa and the second corner wiring CWLb. In this case, the first corner wiring CWLa and the second corner wiring CWLb may extend in the first extension direction EDR1.

In the illustrated embodiment, the pixel circuit PC may include a first line pixel circuit PCa and a second line pixel circuit PCb. The first line pixel circuit PCa may be arranged on a first line 11 that extends in the first extension direction EDR1, and the second line pixel circuit PCb may be arranged on a second line 21 parallel to the first line 11. The first line pixel circuit PCa may be arranged in plural along the first line 11, and the second line pixel circuit PCb may be arranged in plural in the second line 21.

In an embodiment, the first line pixel circuit PCa may include a first line first pixel circuit PC1a, a first line second pixel circuit PC2a, and a first line third pixel circuit PC3a. The second line pixel circuit PCb may include a second line first pixel circuit PC1b, a second line second pixel circuit PC2b, and a second line third pixel circuit PC3b.

The first line first pixel circuit PC1a, the first line second pixel circuit PC2a, and the first line third pixel circuit PC3a may be arranged side by side in the first vertical direction VDR1. In addition, the second line first pixel circuit PC1b, the second line second pixel circuit PC2b, and the second line third pixel circuit PC3b may be arranged side by side in the first vertical direction VDR1.

In the illustrated embodiment, the first corner wiring CWLa may extend in the first extension direction EDR1.

The first corner wiring CWLa may overlap the pixel circuit PC. The first corner wiring CWLa may include a first line data line DLa and a second line data line DLb. The first line data line DLa may include a first line first data line DL1a, a first line second data line DL2a, and a first line third data line DL3a. The second line data line DLb may include a second line first data line DL1b, a second line second data line DL2b, and a second line third data line DL3b.

The first line first data line DL1a may be connected to the first line first pixel circuit PC1a. The first line second data line DL2a may be connected to the first line second pixel circuit PC2a. The first line third data line DL3a may be connected to the first line third pixel circuit PC3a.

The second line first data line DL1b may be connected to the second line first pixel circuit PC1b. The second line second data line DL2b may be connected to the second line second pixel circuit PC2b. The second line third data line DL3b may be connected to the second line third pixel circuit PC3b.

In the illustrated embodiment, the second corner wiring CWLb may be connected to the first line pixel circuit PCa and the second line pixel circuit PCb. In an embodiment, the first lower wiring LWL1 may be connected to the first previous scan line SL1-1 through the bridge line BL. The first previous scan line SL1-1 may be connected to the first line pixel circuit PCa and the second line pixel circuit PCb. Accordingly, the first lower wiring LWL1 may be connected to the first line pixel circuit PCa and the second line pixel circuit PCb.

The first line pixel circuit PCa and the second line pixel circuit PCb are respectively connected to the first line data line DLa and the second line data line DLb, and thus, the first line pixel circuit PCa and the second line pixel circuit PCb may be independent from each other. That is, different signals may be transferred to respective pixel circuits PC by a minimum corner wiring CWL.

Though it is shown in FIG. 14 that the plurality of pixel circuits PC are arranged along the first line 11 and the second line 21, the plurality of pixel circuits PC may be arranged along a plurality of lines in another embodiment.

Figure 15:
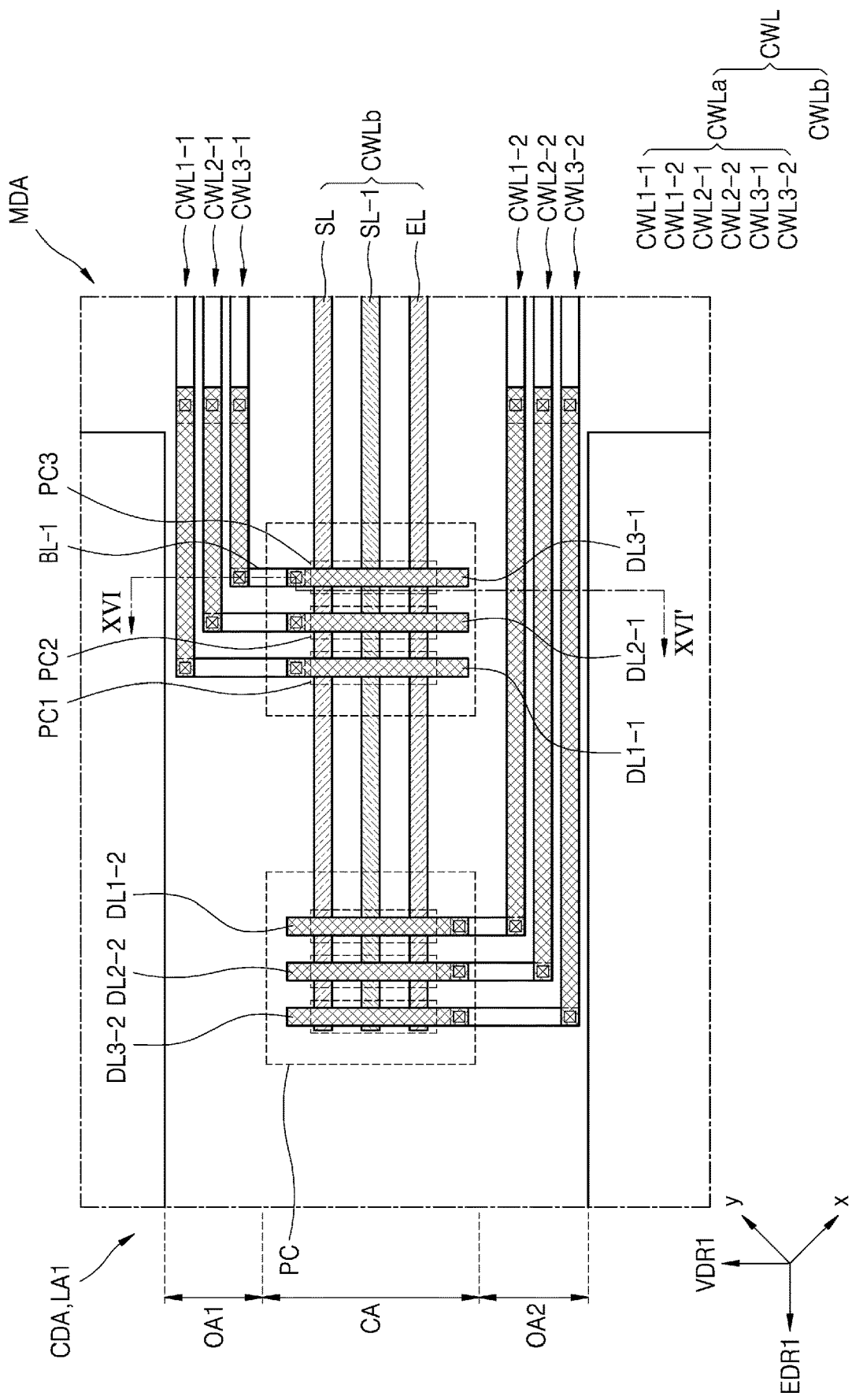
FIG. 15 is a plan view of another embodiment of a corner display area.

FIG. 15 is a plan view of another embodiment of a corner display area.

Referring to FIG. 15, the display panel may include a substrate, a first wiring, a second wiring, the corner wiring CWL, the pixel circuit PC, and the bridge line BL-1. The corner wiring CWL may include the first corner wiring CWLa and the second corner wiring CWLb. In this case, the first corner wiring CWLa and the second corner wiring CWLb may extend in the first extension direction EDR1.

The pixel circuit PC may be arranged in plural in the first extension region LA1. In this case, the plurality of pixel circuits PC may be arranged side by side in the first extension direction EDR1.

The pixel circuit PC may include the first pixel circuit PC1, the second pixel circuit PC2, and the third pixel circuit PC3. The first pixel circuit PC1, the second pixel circuit PC2, and the third pixel circuit PC3 may be arranged side by side. In an embodiment, the first pixel circuit PC1, the second pixel circuit PC2, and the third pixel circuit PC3 may be arranged side by side.

The first corner wiring CWLa may extend in the first extension direction EDR1. The first corner wiring CWLa may be arranged in at least one of the first outer region OA1 and the second outer region OA2. Accordingly, the first corner wiring CWLa may be spaced apart from the pixel circuit PC.

In an embodiment, the first corner wiring CWLa may include a first outer first wiring CWL1-1, a first outer second wiring CWL2-1, a first outer third wiring CWL3-1, a second outer first wiring CWL1-2, a second outer second wiring CWL2-2, and a second outer third wiring CWL3-2. In an embodiment, the first outer first wiring CWL1-1, the first outer second wiring CWL2-1, and the first outer third wiring CWL3-1 may be arranged in the first outer region OA1. The second outer first wiring CWL1-2, the second outer second wiring CWL2-2, and the second outer third wiring CWL3-2 may be arranged in the second outer region OA2. In an embodiment, the first outer first wiring CWL1-1, the first outer second wiring CWL2-1, the first outer third wiring CWL3-1, the second outer first wiring CWL1-2, the second outer second wiring CWL2-2, and the second outer third wiring CWL3-2 may be arranged in the same layer.

In an embodiment, the first corner wiring CWLa may be connected to a bridge line BL-1. Accordingly, the first corner wiring CWLa may be connected to the pixel circuit PC through the bridge line BL-1. In an embodiment, the first corner wiring CWLa and the bridge line BL-1 may be arranged in different layers. In an embodiment, an insulating layer may be arranged on the bridge line BL-1. The first corner wiring CWLa may be arranged on the insulating layer. In this case, the first corner wiring CWLa may be connected to the bridge line BL-1 through a contact hole of the insulating layer. In an embodiment, the first corner wiring CWLa and the bridge line BL-1 may be arranged in the same layer. In this case, the first corner wiring CWLa and the bridge line BL-1 may be provided as one body.

In an embodiment, the first outer first wiring CWL1-1 may be connected to the first outer first data line DL1-1 connected to the first pixel circuit PC1. The first outer second wiring CWL2-1 may be connected to the first outer second data line DL2-1 connected to the second pixel circuit PC2. The first outer third wiring CWL3-1 may be connected to the first outer third data line DL3-1 connected to the third pixel circuit PC3.

In an embodiment, the second outer first wiring CWL1-2 may be connected to the second outer first data line DL1-2 connected to the first pixel circuit PC1. The second outer second wiring CWL2-2 may be connected to the second outer second data line DL2-2 connected to the second pixel circuit PC2. The second outer third wiring CWL3-2 may be connected to the second outer third data line DL3-2 connected to the third pixel circuit PC3.

Accordingly, when N pixel circuits PC are arranged in one first extension region LA1, 3N first corner wirings CWLa may be arranged.

In an embodiment, in the case where the pixel circuit PC further includes a fourth pixel circuit, the first corner wiring CWLa may further include a first outer fourth data line and a second outer fourth data line. In this case, even though N pixel circuits PC are arranged in the first extension region LA1, 4N first corner wirings CWLa may be arranged.

The second corner wiring CWLb may extend in the first extension direction EDR1. The second corner wiring CWLb may be arranged in the central region CA, and may overlap the pixel circuit PC. Accordingly, the second corner wiring CWLb may be directly connected to the pixel circuit PC. The second corner wiring CWLb may include the scan line SL, the previous scan line SL-1, and the emission control line EL. In an embodiment, one of the scan line SL, the previous scan line SL-1, and the emission control line EL may be arranged in a layer different from another of the scan line SL, the previous scan line SL-1, and the emission control line EL. In an embodiment, the scan line SL and the emission control line EL may be arranged in a layer different from the previous scan line SL-1.

In the illustrated embodiment, in the case where the pixel circuits PC are arranged in a line side by side in the first extension direction EDR1, three second corner wirings CWLb may be arranged in the first extension region LA1.

Figure 16:
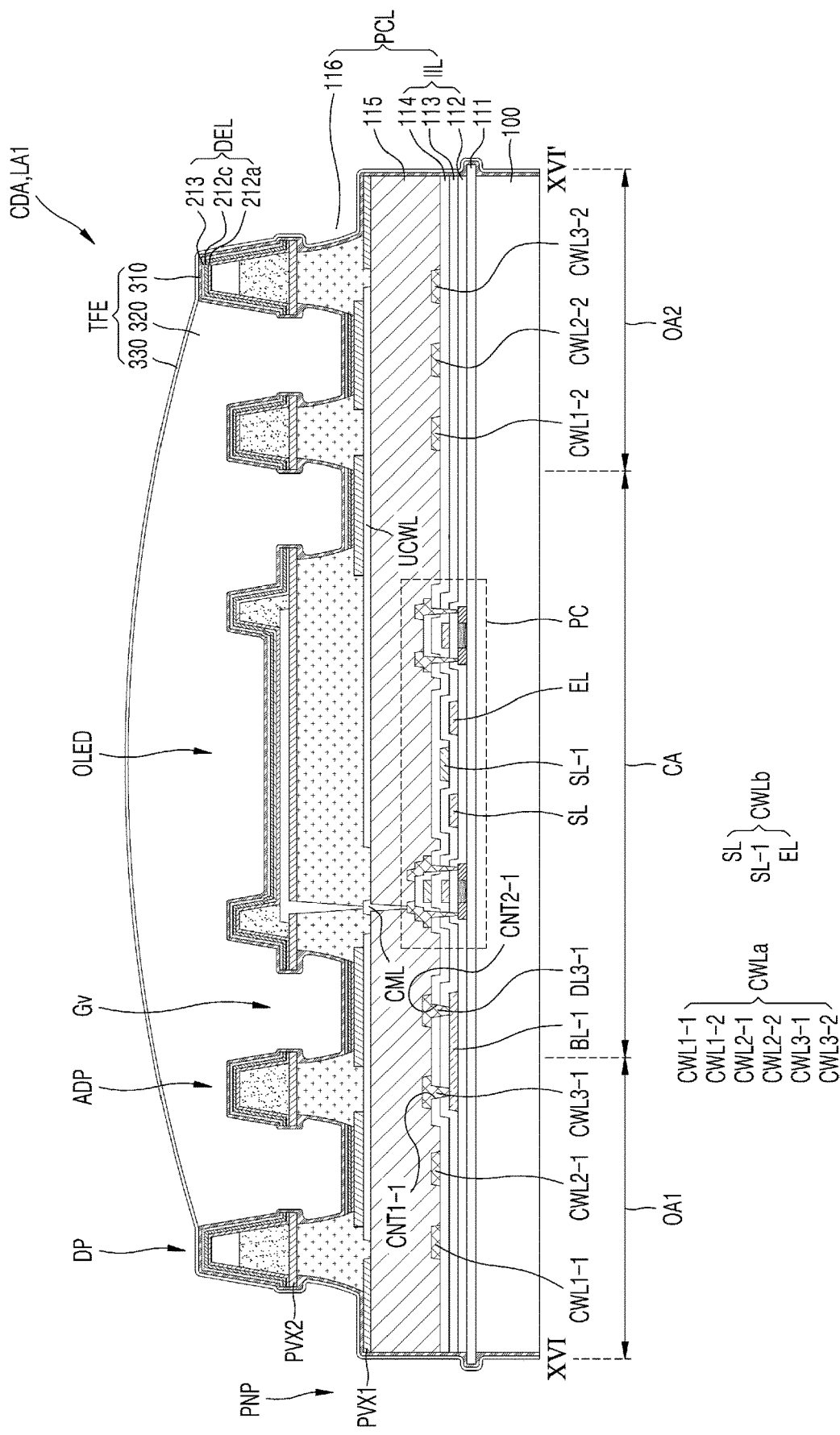
FIG. 16 is a cross-sectional view of an embodiment of a corner display area taken along line XVI-XVI' of FIG. 15.

FIG. 16 is a cross-sectional view of a corner display area taken along line XVI-XVI' of FIG. 15. In FIG. 16, the same reference numerals as those of FIG. 9 denote the same members, and thus, repeated descriptions thereof are omitted.

Referring to FIG. 16, the display panel may include the substrate 100, the buffer layer 111, the pixel circuit layer PCL, the display element layer DEL, and the thin-film encapsulation layer TFE.

The substrate 100 may include a corner display area, and the corner display area may include a plurality of extension regions. The space PNP may be defined between adjacent extension regions of the plurality of extension regions. The first extension region LA1 from among the plurality of extension regions may include the central region CA, the first outer region OA1, and the second outer region OA2. The first outer region OA1 and the second outer region OA2 may be respectively on two opposite sides of the central region CA.

The buffer layer 111, the pixel circuit layer PCL, the display element layer DEL, and the thin-film encapsulation layer TFE may be stacked on the substrate 100. The pixel circuit layer PCL may include the inorganic insulating layer IIL, the first corner wiring CWLa, the second corner wiring CWLb, the first outer third data line DL3-1, the pixel circuit PC, the first planarization layer 115, and the second planarization layer 116. The inorganic insulating layer IIL may include the first gate insulating layer 112, the second gate insulating layer 113, and the interlayer insulating layer 114. The display element layer DEL may include an organic light-emitting diode OLED.

The first corner wiring CWLa may include a first outer first wiring CWL1-1, a first outer second wiring CWL2-1, a first outer third wiring CWL3-1, a second outer first wiring CWL1-2, a second outer second wiring CWL2-2, and a second outer third wiring CWL3-2. In an embodiment, the first outer first wiring CWL1-1, the first outer second wiring CWL2-1, and the first outer third wiring CWL3-1 may be arranged in the first outer region OA1. The second outer first wiring CWL1-2, the second outer second wiring CWL2-2, and the second outer third wiring CWL3-2 may be arranged in the second outer region OA2.

The second corner wiring CWLb may include the previous scan line SL-1 and the emission control line EL. The scan line SL, the previous scan line SL-1, and the emission control line EL may be arranged in the central region CA.

A semiconductor layer of the first pixel circuit PC1 may be arranged on the buffer layer 111. The first gate insulating layer 112 may cover the semiconductor layer.

In an embodiment, the scan line SL, the emission control line EL, and the bridge line BL-1 may be arranged on the first gate insulating layer 112. The second gate insulating layer 113 may cover the scan line SL, the emission control line EL, and the bridge line BL-1.

In an embodiment, at least one of the scan line SL, the emission control line EL, and the bridge line BL-1 may include a conductive material including at least one of molybdenum (Mo), aluminum (Al), copper (Cu), and titanium (Ti) and include a single layer or a multi-layer including the above material. In an embodiment, at least one of the scan line SL, the emission control line EL, and the bridge line BL-1 may be simultaneously formed while the gate electrode GE of FIG. 6A is formed.

The previous scan line SL-1 may be arranged on the second gate insulating layer 113. The interlayer insulating layer 114 may cover the previous scan line SL-1. In an embodiment, the previous scan line SL-1 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and include a single layer or a multi-layer including the above materials. The previous scan line SL-1 may be simultaneously formed while the top electrode CE2 of FIG. 6A is formed.

In an embodiment, the first outer first wiring CWL1-1, the first outer second wiring CWL2-1, the first outer third wiring CWL3-1, the second outer first wiring CWL1-2, the second outer second wiring CWL2-2, and the second outer third wiring CWL3-2 may be arranged on the interlayer insulating layer 114. The first outer first wiring CWL1-1, the first outer second wiring CWL2-1, the first outer third wiring CWL3-1, the second outer first wiring CWL1-2, the second outer second wiring CWL2-2, and the second outer third wiring CWL3-2 may be spaced apart from each other.

In an embodiment, a first contact hole CNT1-1 and a second contact hole CNT2-1 may be defined in the second gate insulating layer 113 and the interlayer insulating layer 114. In this case, the first outer third wiring CWL3-1 may be connected to the bridge line BL-1 through the first contact hole CNT1-1. The first outer third data line DL3-1 may be connected to the bridge line BL-1 through the second contact hole CNT2-1.

In an embodiment, at least one of the first outer third data line DL3-1, the first outer first wiring CWL1-1, the first outer second wiring CWL2-1, the first outer third wiring CWL3-1, the second outer first wiring CWL1-2, the second outer second wiring CWL2-2, and the second outer third wiring CWL3-2 may include a conductive material including at least one of molybdenum (Mo), aluminum (Al), copper (Cu), and titanium (Ti) and include a single layer or a multi-layer including the above material. In an embodiment, at least one of the first outer third data line DL3-1, the first outer first wiring CWL1-1, the first outer second wiring CWL2-1, the first outer third wiring CWL3-1, the second outer first wiring CWL1-2, the second outer second wiring CWL2-2, and the second outer third wiring CWL3-2 may have a multi-layered structure of Ti/Al/Ti.

Figure 17:
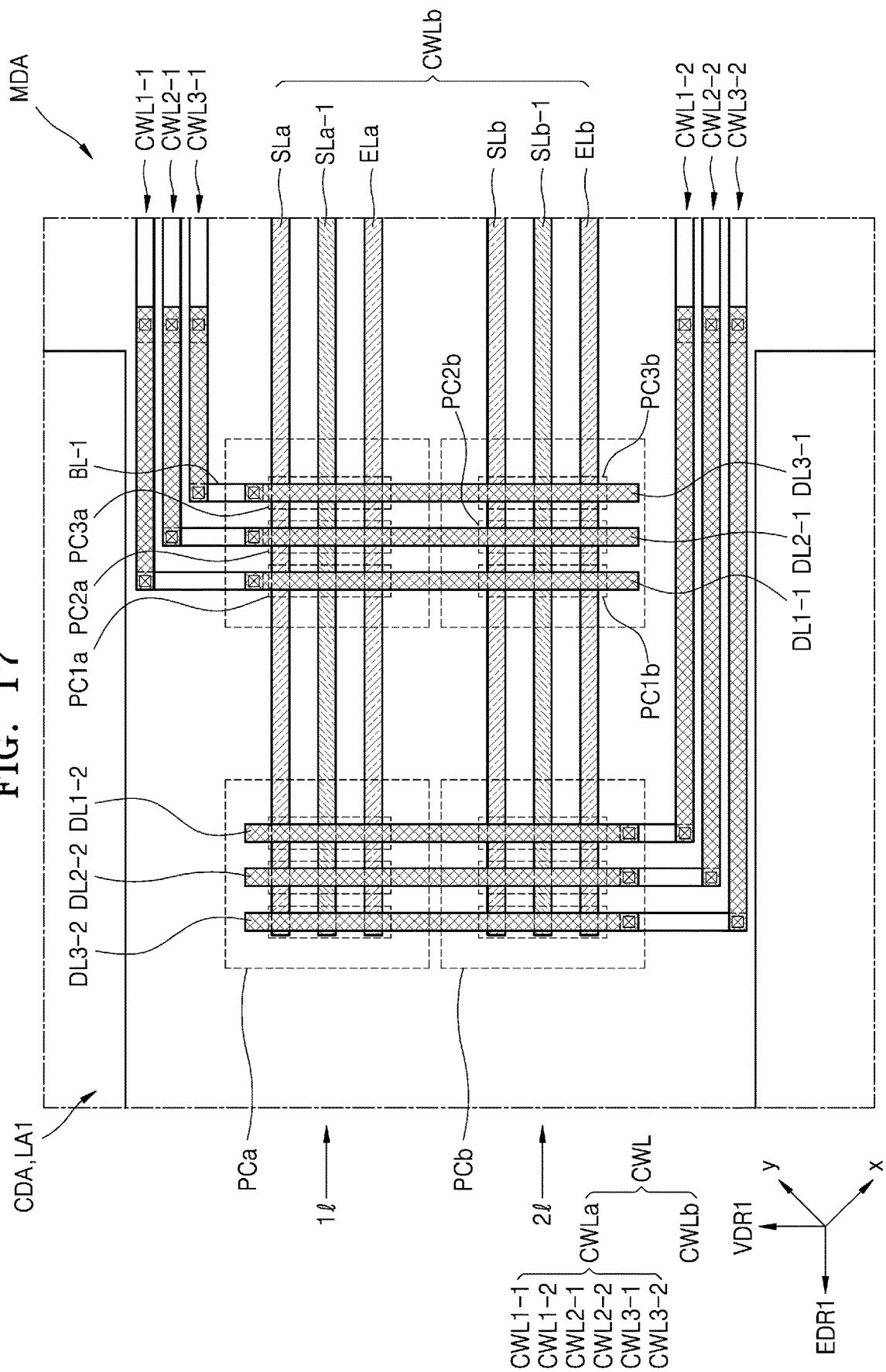
FIG. 17 is a plan view of another embodiment of a corner display area.

FIG. 17 is a plan view of an embodiment of the corner display area CDA. In FIG. 17, the same reference numerals as those of FIG. 15 denote the same members, and thus, repeated descriptions thereof are omitted.

Referring to FIG. 17, the display panel may include a substrate, a first wiring, a second wiring, the corner wiring CWL, the pixel circuit PC, and the bridge line BL. The corner wiring CWL may include the first corner wiring CWLa and the second corner wiring CWLb. In this case, the first corner wiring CWLa and the second corner wiring CWLb may extend in the first extension direction EDR1.

In the illustrated embodiment, the pixel circuit PC may include the first line pixel circuit PCa and the second line pixel circuit PCb. The first line pixel circuit PCa may be arranged on a first line 11 that extends in the first extension direction EDR1, and the second line pixel circuit PCb may be arranged on a second line 21 parallel to the first line 11. The first line pixel circuit PCa may be arranged in plural along the first line 11, and the second line pixel circuit PCb may be arranged in plural in the second line 21.

The first line first pixel circuit PC1a, the first line second pixel circuit PC2a, and the first line third pixel circuit PC3a may be arranged side by side in the first extension direction EDR1. In addition, the second line first pixel circuit PC1b, the second line second pixel circuit PC2b, and the second line third pixel circuit PC3b may be arranged side by side in the first extension direction EDR1.

In the illustrated embodiment, the first corner wiring CWLa may be connected to the first line pixel circuit PCa and the second line pixel circuit PCb. In an embodiment, the first outer first wiring CWL1-1 may be connected to the first outer first data line DL1-1 through the bridge line BL-1. The first outer first data line DL1-1 may be connected to the first line first pixel circuit PC1a and the second line first pixel circuit PC1b. Accordingly, the first outer first wiring CWL1-1 may be connected to the first line first pixel circuit PC1a and the second line first pixel circuit PC1b.

In the illustrated embodiment, the second corner wiring CWLb may extend in the first extension direction EDR1. The second corner wiring CWLb may overlap the pixel circuit PC. The second corner wiring CWLb may include a first line scan line SLa, a first line previous scan line SLa-1, a first line emission control line ELa, a second line scan line SLb, a second line previous scan line SLb-1, and a second line emission control line ELb.

The first line scan line SLa, the first line previous scan line SLa-1, and the first line emission control line ELa may be connected to the first line pixel circuit PCa. The second line scan line SLb, the second line previous scan line SLb-1, and the second line emission control line ELb may be connected to the second line pixel circuit PCb.

The first line pixel circuit PCa and the second line pixel circuit PCb are connected to the first line scan line SLa and the second line scan line SLb respectively, and thus, the first line pixel circuit PCa and the second line pixel circuit PCb may be independent of each other. That is, different signals may be transferred to respective pixel circuits PC by a minimum corner wiring CWL.

Though it is shown in FIG. 17 that the plurality of pixel circuits PC is arranged in the first line 11 and the second line 21, the plurality of pixel circuits PC may be arranged along a plurality of lines in another embodiment.

As described above, embodiments may include the first corner wiring and the second corner wiring each extending in the first extension direction. Therefore, the pixel circuit arranged in the corner display area may receive power or a signal from the first corner wiring and the second corner wiring.

It should be understood that embodiments described herein should be considered in a descriptive sense only and not for purposes of limitation. Descriptions of features or features within each embodiment should typically be considered as available for other similar features or features in other embodiments. While one or more embodiments have been described with reference to the drawing figures, it will be understood by those of ordinary skill in the art that various changes in form and details may be made therein without departing from the spirit and scope as defined by the following claims.

What is claimed is:

1. A display panel comprising:
   a substrate including a firstfront display area and a corner display area;
   a plurality of first pixel circuits disposed on the front display area;
   a plurality of second pixel circuits disposed on the corner display area;
   a first wiring extending in a first direction in the front display area, the first wiring connected to at least one of the plurality of first pixel circuits;
   a second wiring extending in a second direction crossing the first direction in the front display area, the first wiring connected to at least one of the plurality of first pixel circuits;
   a first corner wiring arranged in the corner display area and directly connected to the first wiring; and
   a second corner wiring arranged in the corner display area and directly connected to the second wiring,
   wherein the first corner wiring and the second corner wiring extend in a first extension direction intersecting the first direction and the second direction in the corner display area.

2. The display panel of claim 1, wherein the plurality of first pixel circuits are arranged along the first direction and the second direction and
   wherein at least some of the plurality of second pixel circuits are arranged along the first extension direction.

3. A display panel comprising:
   a substrate including a front display area and a corner display area;
   a plurality of first pixel circuits disposed on the front display area;
   a plurality of second pixel circuits disposed on the corner display area;
   a first wiring extending in a first direction in the front display area, the first wiring connected to at least one of the plurality of first pixel circuits;
   a second wiring extending in a second direction crossing the first direction in the front display area, the first wiring connected to at least one of the plurality of first pixel circuits;
   a first corner wiring arranged in the corner display area and connected to the first wiring; and
   a second corner wiring arranged in the corner display area and connected to the second wiring,
   wherein the first corner wiring and the second corner wiring extend in a first extension direction intersecting the first direction and the second direction in the corner display area, and
   wherein the first corner wiring overlaps at least some of the plurality of second pixel circuits, and the second corner wiring is connected to at least one of the plurality of second pixel circuits through the bridge line extending a first perpendicular direction perpendicular to the first extension direction.

4. The display panel of claim 3, wherein the second corner wiring is connected to at least two of a plurality of second pixel circuits.

5. The display panel of claim 1, wherein the first wiring and the first corner wiring are data lines, and the second wiring and the second corner wiring are scan lines.

6. The display panel of claim 1, wherein the first corner wiring and the second corner wiring are arranged in different layers.

7. The display panel of claim 1, wherein the second corner wiring includes a lower wiring and an upper wiring arranged in different layers, and
   the lower wiring and the upper wiring are alternately arranged in a first perpendicular direction perpendicular to the first extension direction.

8. The display panel of claim 1, wherein each of the plurality of second pixel circuits includes a first sub-pixel circuit, a second sub-pixel circuit, and a third sub-pixel circuit, and wherein the first sub-pixel circuit, the second sub-pixel circuit, and the third sub-pixel circuit are arranged side by side in the first extension direction.

9. The display panel of claim 1, wherein each of the plurality of second pixel circuits includes a first sub-pixel circuit, a second sub-pixel circuit, and a third sub-pixel circuit, and
wherein the first sub-pixel circuit, the second sub-pixel circuit, and the third sub-pixel circuit are arranged side by side in a first perpendicular direction perpendicular to the first extension direction.

10. The display panel of claim 1, wherein the substrate further comprises a third display area arranged between the front display area and the corner display area, and
the display panel further includes a driving circuit arranged in the third display area, and the second corner wiring is connected to the driving circuit.

11. A display apparatus comprising:
a display panel; and
a cover window covering the display panel,
the display panel comprising:
a substrate including a front display area and a corner display area;
a plurality of first pixel circuits disposed on the front display area;
a plurality of second pixel circuits disposed on the corner display area;
a first wiring extending in a first direction in the front display area, the first wiring connected to at least one of the plurality of first pixel circuits;
a second wiring extending in a second direction crossing the first direction in the front display area, the first wiring connected to at least one of the plurality of first pixel circuits;
a first corner wiring arranged in the corner display area and directly connected to the first wiring; and
a second corner wiring arranged in the corner display area and directly connected to the second wiring;
wherein the first corner wiring and the second corner wiring extend in a first extension direction while the display panel is flat, the first extension direction intersecting the first direction and the second direction in the corner display area.

12. The display apparatus of claim 11, wherein the plurality of first pixel circuits are arranged along the first direction and the second direction and
wherein at least some of the plurality of second pixel circuits are arranged along the first extension direction.

13. The display apparatus of claim 11, wherein the first corner wiring overlaps at least some of the plurality of second pixel circuits, and the second corner wiring is connected to at least one of the plurality of second pixel circuits through the bridge line extending a first perpendicular direction perpendicular to the first extension direction.

14. The display apparatus of claim 13, wherein the second corner wiring is connected to at least two of a plurality of second pixel circuits.

15. The display apparatus of claim 11, wherein the first wiring and the first corner wiring are data lines, and the second wiring and the second corner wiring are scan lines.

16. The display apparatus of claim 11, wherein the first corner wiring and the second corner wiring are arranged in different layers.

17. The display apparatus of claim 11, wherein the second corner wiring includes a lower wiring and an upper wiring arranged in different layers, and
the lower wiring and the upper wiring are alternately arranged in a first perpendicular direction perpendicular to the first extension direction.

18. The display apparatus of claim 11, wherein the substrate further comprises a third display area arranged between the front display area and the corner display area, and
the display panel further includes a driving circuit arranged in the third display area, and the second corner wiring is connected to the driving circuit.

19. The display apparatus of claim 11, wherein the cover window includes a curved portion.

20. The display apparatus of claim 11, wherein the corner display area is arranged at a corner of the front display area and bent.

* * * * *